United States Patent
Yoshioka et al.

(10) Patent No.: US 6,689,515 B2
(45) Date of Patent: Feb. 10, 2004

(54) PHASE-SHIFTING PHOTOMASK BLANK, PHASE-SHIFTING PHOTOMASK, METHOD FOR PRODUCING THEM AND APPARATUS FOR MANUFACTURING THE BLANK

(75) Inventors: Nobuyuki Yoshioka, Hyogo-ken (JP); Akihiko Isao, Saitama-ken (JP); Susumu Kawada, Saitama-ken (JP); Tsuneo Yamamoto, Saitama-ken (JP); Jun Amano, Saitama-ken (JP); Ryoichi Kobayashi, Saitama-ken (JP)

(73) Assignees: Ulvac Coating Corporation, Chichibu (JP); Mitsubishi Denki Kabushiki Kaisha, Tokyo (JP)

( * ) Notice: Subject to any disclaimer, the term of this patent is extended or adjusted under 35 U.S.C. 154(b) by 94 days.

(21) Appl. No.: 09/805,902

(22) Filed: Mar. 15, 2001

(65) Prior Publication Data

US 2001/0018154 A1 Aug. 30, 2001

Related U.S. Application Data

(62) Division of application No. 09/292,936, filed on Apr. 16, 1999, now Pat. No. 6,228,541.

(30) Foreign Application Priority Data

Sep. 17, 1998 (JP) .............................................. 10-263554

(51) Int. Cl.$^7$ ................................................. G03F 9/00
(52) U.S. Cl. ...................................... 430/5; 204/298.11
(58) Field of Search ......................... 430/5; 204/298.01, 204/298.11, 192.11, 192.12

(56) References Cited

U.S. PATENT DOCUMENTS

| | | | |
|---|---|---|---|
| 5,804,337 A | 9/1998 | Mitsui | 430/5 |
| 5,942,356 A | 8/1999 | Mitsui et al. | 430/5 |
| 5,981,054 A | 11/1999 | Hikosaka et al. | 428/328 |
| 6,432,286 B1 * | 8/2002 | Glocker | 204/298.18 |

* cited by examiner

Primary Examiner—S. Rosasco
(74) Attorney, Agent, or Firm—Arent Fox Kintner Plotkin & Kahn

(57) ABSTRACT

A uniform thin phase-shifting photomask blank can be formed by depositing a thin film on a substrate by a reactive sputtering technique while passing, at least four times, the substrate over a sputtering target. In the formation of the blank, NO gas is used as the reactive gas, a target composed of a mixture of molybdenum and silicon is used as the sputtering target and a transparent substrate is used as the thin film-forming substrate to form, on the transparent substrate, a light-transmitting film capable of transmitting light rays having an intensity, which cannot substantially contribute to the exposure. In addition, the film is formed, on the substrate, through an opening having a sufficiently enlarged length along the substrate-conveying direction so that even regions whose deposition rate of the target component is not more than 90% of the maximum level thereof also contribute to the film-formation. The phase-shifting photomask blank thus prepared is subjected to a patterning treatment to form a phase-shifting photomask.

2 Claims, 14 Drawing Sheets

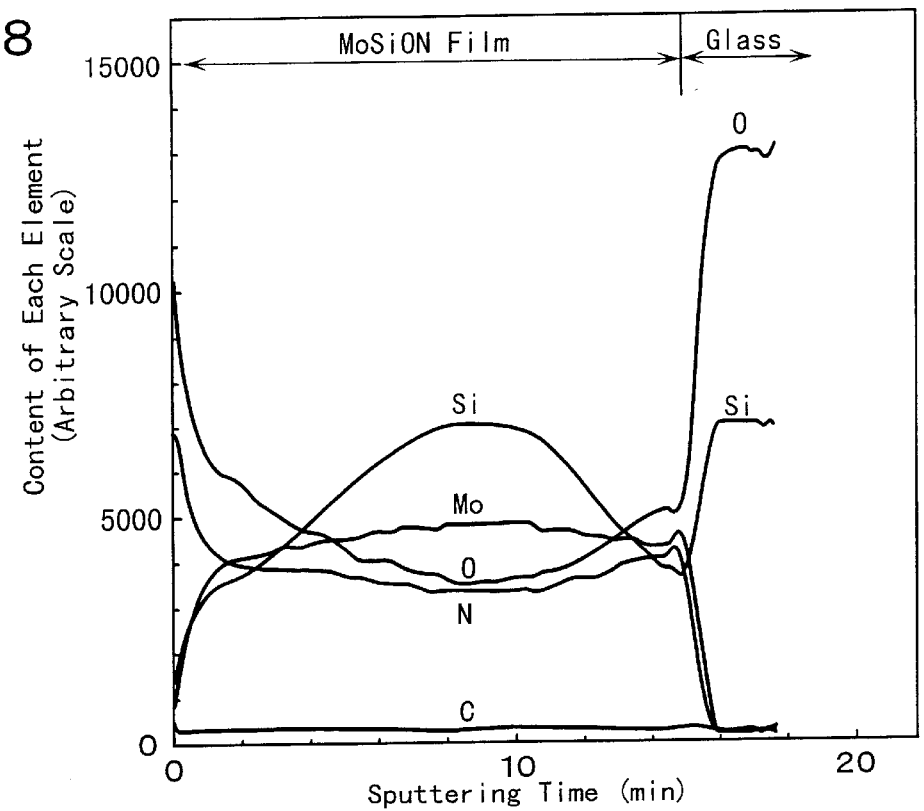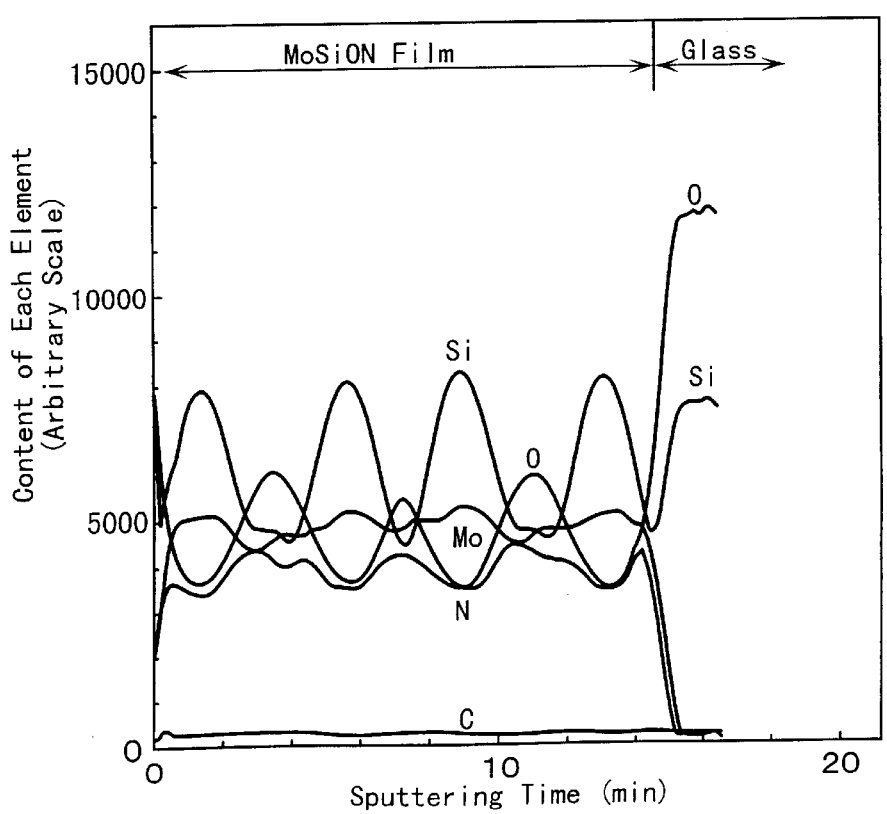

↓ i-Line-Exposure・Development

↓ RF Ion Etching

↓

Electron Beam-Exposure・Development

RF Ion Etching

Fig. 24A
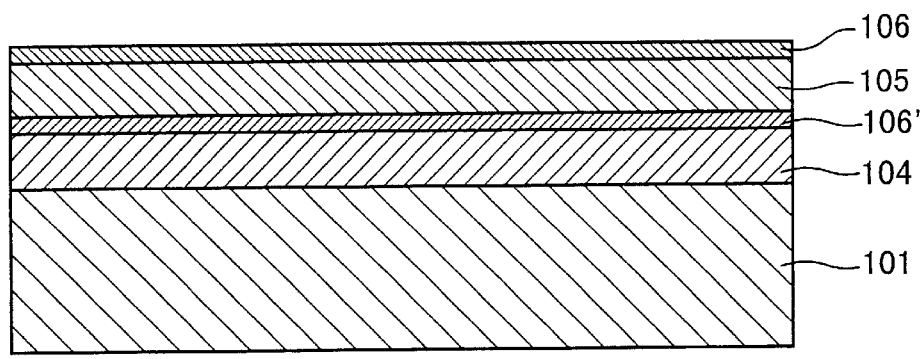
Fig. 24B
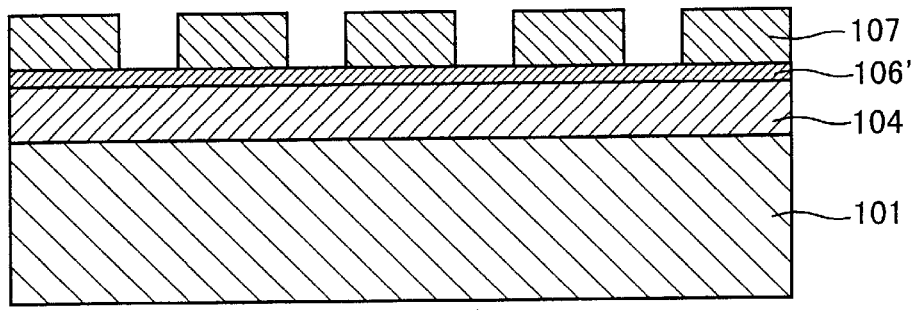

PHASE-SHIFTING PHOTOMASK BLANK, PHASE-SHIFTING PHOTOMASK, METHOD FOR PRODUCING THEM AND APPARATUS FOR MANUFACTURING THE BLANK

This is a Division of application Ser. No 09/292,936 filed Apr. 16, 1999 now U.S. Pat. No. 6,228,541. The disclosure of the prior application is hereby incorporated by reference herein in its entirety.

BACKGROUND OF THE INVENTION

1. Field of the Invention

The present invention relates to a method for preparing a thin film and more particularly to a phase-shifting photomask blank which permits the improvement of transferred patterns in their resolution by making a difference in phase between exposed light rays passing through a mask and a phase-shifting photomask prepared from the phase-shifting photomask blank as well as a method for producing the photomask blank and the photomask and an apparatus for manufacturing the phase-shifting photomask blank. In other words, the present invention relates to a so-called half-tone type phase-shifting photomask blank, a phase-shifting photomask as well as a method for producing them and an apparatus for manufacturing the phase-shifting photomask blank.

2. Disclosure of the Related Art

In case of a phase-shifting photomask 208 as shown in FIG. 21(B), a circuit pattern 230 to be transferred onto a semiconductor substrate has in general been formed by making use of a phase-shifting photomask which is produced by etching the surface of a phase-shifting photomask blank 200 which consists of a quartz substrate 201 and a phase-shifting film 204, as shown in FIG. 21(A), to remove a desired portion of the film 204 and to thus form openings 210 through which the surface of the quartz substrate 201 is exposed and phase-shifting portions 205, i.e., the unetched portions of the film 204 remaining on the substrate.

The phase-shifting portion 205 has light-transmission properties to the exposed light rays and the thickness thereof is designed in such a manner that a phase of the exposed light rays transmitting through the opening 210 has a phase difference, by 180 degrees, from that of the light rays transmitting through the phase-shifting portion 205. Therefore, when exposing a wafer as shown in FIG. 21(C) to light rays, the light intensity observed on the wafer at the boundary between the opening 210 and the phase-shifting portion 205 becomes zero. For this reason, the circuit pattern transferred using the phase-shifting photomask 208 would have a high resolution.

As the phase-shifting film 204, there have in general been used a monolayer or multi-layer film and it has been desired for the phase-shifting portion 205 to have a light-transmittance to the exposed light rays in the range of from 4% to 40% in order to obtain an appropriate quantity of exposed light rays during lithography operations and to control the thickness, as determined after development, of a resist film applied onto the wafer.

Up to now, when forming a monolayer phase-shifting film 204 having a desired thickness on a substrate on which a film is deposited (hereinafter simply referred to as "film-forming substrate") in order to form a phase-shifting photomask blank as shown in FIG. 21(A) using a film-forming device wherein a reactive gas is supplied to a film-forming chamber and a thin film is formed on the film-forming substrate according to the reactive sputtering technique while passing the substrate over a sputtering target, a film is formed by passing the substrate over the target only one time by controlling the deposition rate of the film on the substrate and the conveying speed of the substrate in such a manner that a desired film thickness can be obtained by a single pass (see, for instance, Japanese Un-Examined Patent Publication (hereinafter referred to as "J.P. KOKAI") No. Hei 9-17928). The disclosure of the above publication is hereby incorporated by reference herein.

Such a conventional technique will hereinafter be described with reference to the attached FIG. 1. FIG. 1 shows a part of a film-forming chamber 11 of a film-forming device. A mixed gas comprising a sputtering gas and a reactive gas is supplied to the film-forming chamber through a gas-supply port 14 after vacuum exhaustion through an exhaust port 15. A DC voltage which is negative with respect to the grounding voltage is applied to a sputtering target 12 (MoSi) to thus form a discharge zone in the proximity to the sputtering target and as a result, the target 12 begins to discharge sputter materials. If a film-forming quartz substrate 101 is continuously conveyed along a conveying path 18 positioned at a predetermined distance from the target 12, a desired film is formed on the substrate.

As has been discussed above, when forming the monolayer film having a desired thickness on the film-forming substrate using the film-forming device wherein the reactive gas is supplied to the film-forming chamber and the film is formed on the film-forming substrate according to the reactive sputtering technique while passing the substrate over the sputtering target, the thin film has conventionally been formed by passing the substrate over the target only one time by controlling the deposition rate of the film on the substrate and the conveying speed of the substrate in such a manner that a desired film thickness can be obtained by a single pass. In this case, however, the thickness distribution of the monolayer film has a tendency as shown in FIG. 1. More specifically, FIG. 1 shows the deposition rate distribution of the target component 19-1 (or the thickness distribution of the target component formed on a static substrate). The distribution of the target component along a conveying path 18 is not uniform and therefore, the higher the deposition rate of the target component along the conveying path 18, the larger the amount of the unreacted target component if it is assumed that the frequency of the reactive gas incident upon the substrate 101 is approximately constant along the conveying path 18 as shown in FIG. 1 (see line 19-2). Accordingly, the content of the reaction product in the resulting film is low and a non-uniform film is formed on the conveyed substrate. If an opening 17-1 positioned between shielding plates 17 is divided into regions A, B and C arranged along the conveying path 18, a non-uniform film 31 shown in FIG. 2 is formed on the substrate 101 by a single forward movement of the substrate 101, in a horizontal direction, over a target 12. The non-uniform film is thus formed on the substrate and this accordingly results in various drawbacks. For instance, the resulting film shows optical characteristics which are widely different from those expected for a uniform monolayer film and exhibits resistance to chemicals considerably inferior to that of a uniform film. Moreover, this film cannot optically be handled as a monolayer film and this in turn results in such disadvantages that this makes the calculation of the optical constants quite difficult and that the design and the quality control of films become difficult. In order to eliminate such drawbacks, it has been devised to reduce the lengths of the opening 17-1 of the shielding plate and that of a chimney 13 along the substrate-conveying direction (this is referred to as "opening length")

so that only the region B (for instance, the region whose deposition rate is not less than 90% of the maximum level thereof) in which the deposition rate of the target component is approximately constant contributes to the film-formation, or so that even a part of the region A contributes to the film-formation. However, the former suffers from a problem of reduction of the utilization efficiency of the target 12 (the ratio of the amount of the target capable of being used in the film-formation to the total consumed amount thereof) and productivity, while the latter suffers from a problem of, for instance, the reduction in the utilization efficiency of the target according to the reduction in the opening length, the deterioration of the resistance to chemicals due to the non-uniformity of the film composition and complication of optical characteristics.

SUMMARY OF THE INVENTION

Accordingly, it is generally an object of the present invention to solve the foregoing problems associated with the conventional sputtering techniques and specifically to provide a substantially uniform thin film which can ensure optical characteristics quite similar to those expected for a uniform monolayer film and resistance to chemicals almost comparable to is that observed for a uniform monolayer film without impairing the utilization efficiency of a target and productivity of films and which can optically be handled as a substantial monolayer film and which makes the calculation of optical constants of the film, the design and the quality control thereof easy, in particular, a phase-shifting photomask blank and a phase-shifting photomask excellent in resistance to chemicals and optical characteristics.

Another object of the present invention is to provide a phase-shifting photomask which can be prepared from the foregoing phase-shifting photomask blank.

A further object of the present invention is to provide a method for preparing such a phase-shifting photomask blank and such a phase-shifting photomask.

Still another object of the present invention is to provide a device for manufacturing such a phase-shifting photomask blank.

According to a first aspect of the present invention, there is provided a method for preparing a thin film which comprises supplying a reactive gas to a film-forming chamber and depositing a film on a film-forming substrate by the reactive sputtering technique while passing the substrate over a sputtering target, wherein the film is formed while passing, at least 4 times, the substrate over the target and establishing sufficient lengths of the openings of shielding plate and chimney to thus form a substantially uniform film on the substrate without impairing the utilization efficiency of the target and the productivity of the film. The method makes it easy to produce, in particular, a desired phase-shifting photomask blank and a desired phase-shifting photomask.

According to a second aspect of the present invention, there is provided a phase-shifting photomask blank which comprises a thin film formed on a substrate according to the reactive sputtering technique in which a reactive gas is supplied to a film-forming chamber and a film is formed on a film-forming substrate while passing, at least 4 times, the substrate over a sputtering target.

According to a third aspect of the present invention, there is provided a phase-shifting photomask which comprises a pattern consisting of light semitransparent portions and light transmitting portions transparent to light rays having an intensity substantially contributing to light-exposure, the pattern being produced by subjecting the light semitransparent film of the foregoing phase-shifting photomask blank to a pattern-forming or patterning treatment to thus remove a part of the light semitransparent film.

According to a fourth aspect of the present invention, there is provided a device for manufacturing a phase-shifting photomask blank in which a film is formed by supplying a reactive gas to a film-forming chamber and depositing a thin film on a film-forming substrate using the reactive sputtering technique, while passing the substrate over a sputtering target, and which is designed so that even regions whose deposition rate of the target component is not more than 90% of the maximum level thereof also contribute to the film-formation by sufficiently enlarging an opening length along the substrate-conveying direction.

BRIEF DESCRIPTION OF THE DRAWINGS

The aforementioned and other objects, features and advantages of the present invention will become more apparent from the following description taken with reference to the accompanying drawings, wherein:

FIG. 8 is a diagram showing the results obtained by analyzing the film composition of the sample No. 1 prepared in Example 1, using an Auger electron spectrometer;

FIG. 9 is a diagram showing the results obtained by analyzing the film composition of the sample No. 2 prepared in Example 1, using an Auger electron spectrometer;

Figure 17:
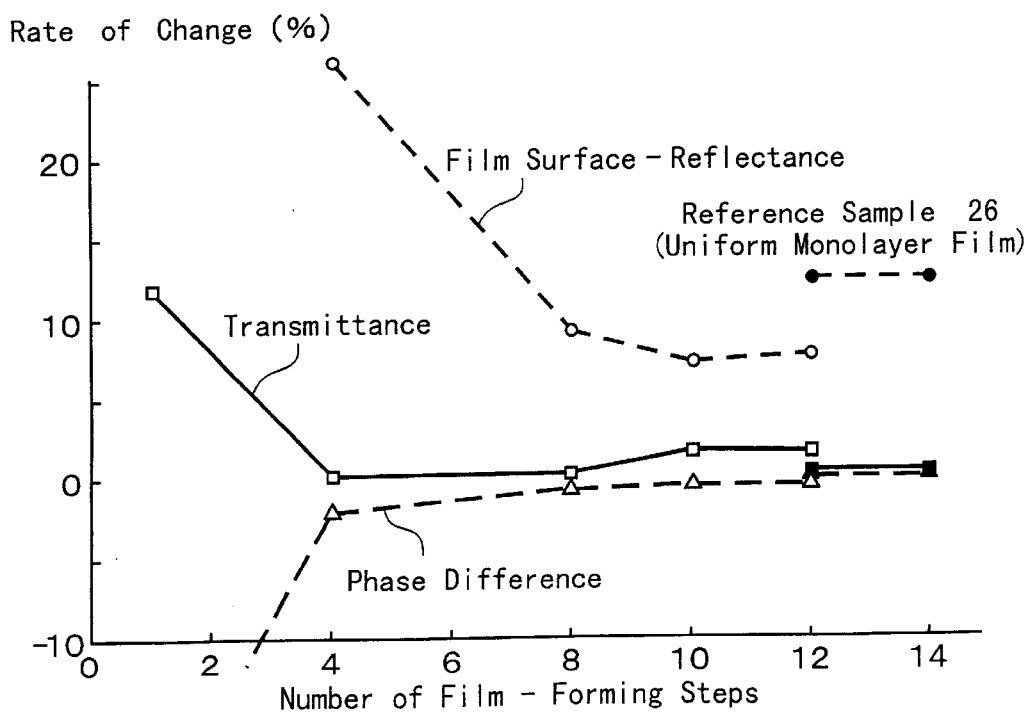
Figure 18:
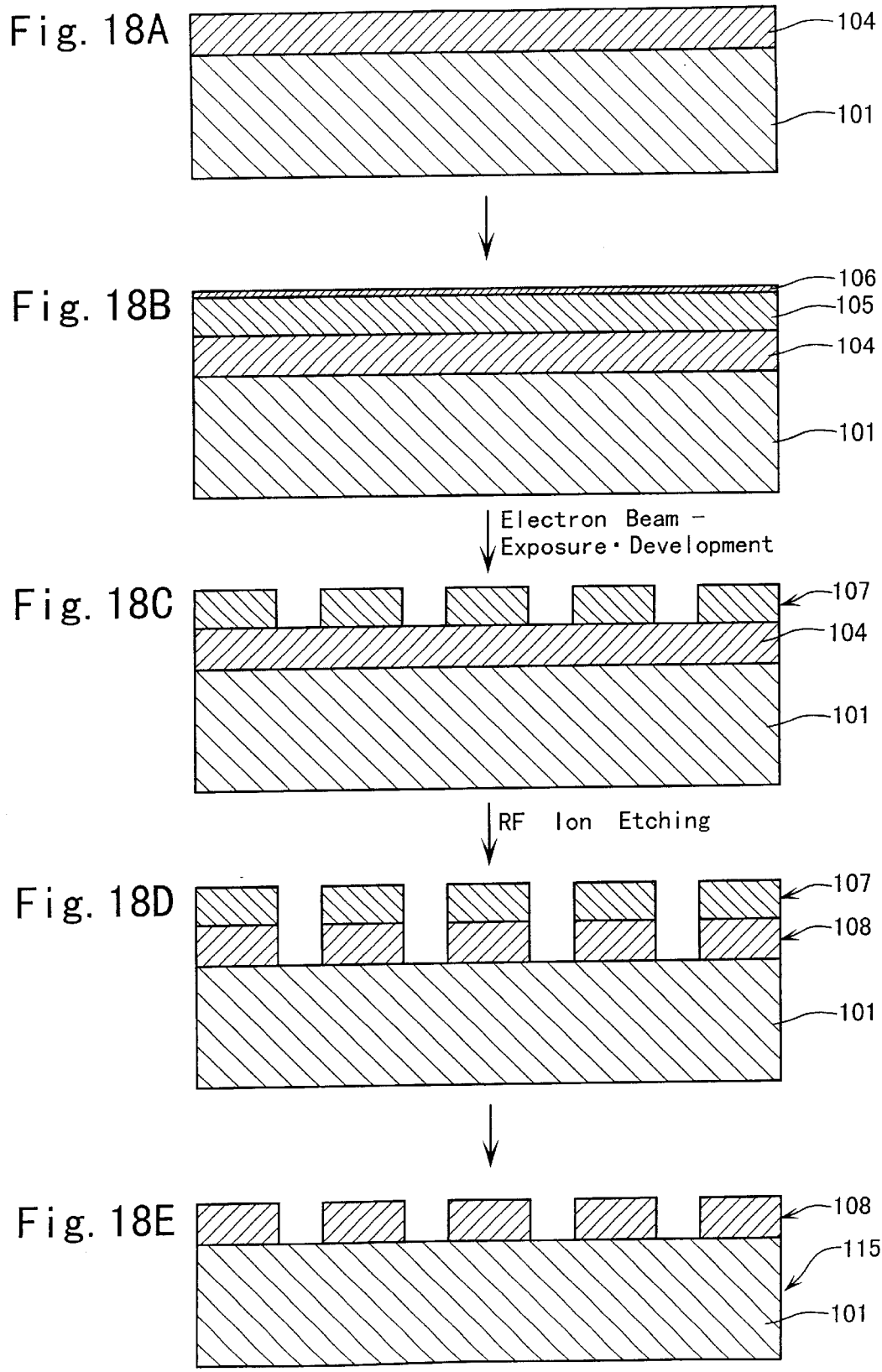
Figure 19:
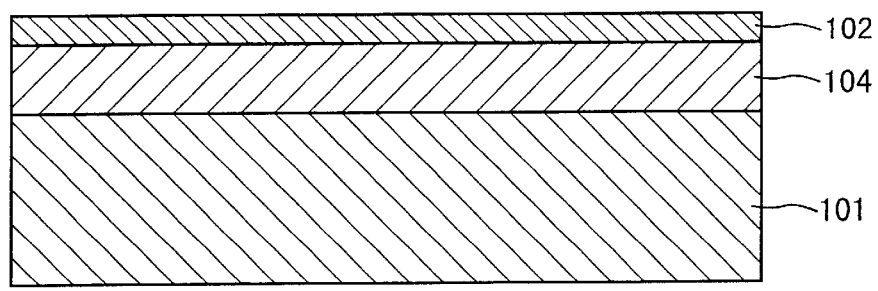
Figure 20:
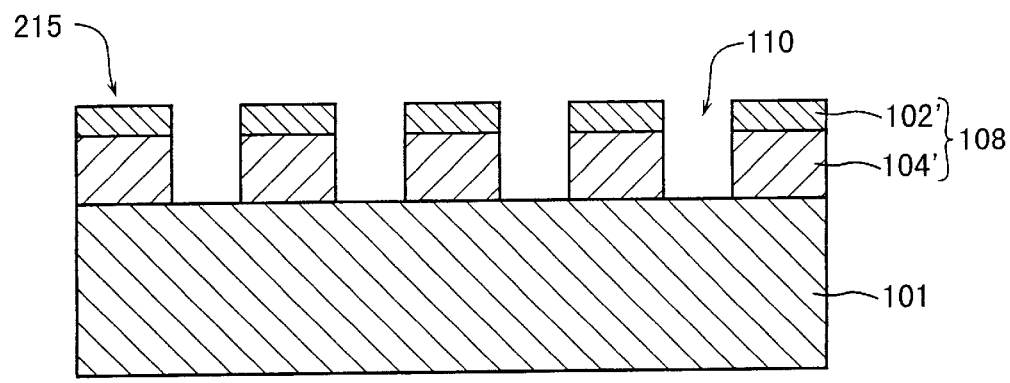
Figure 21A:
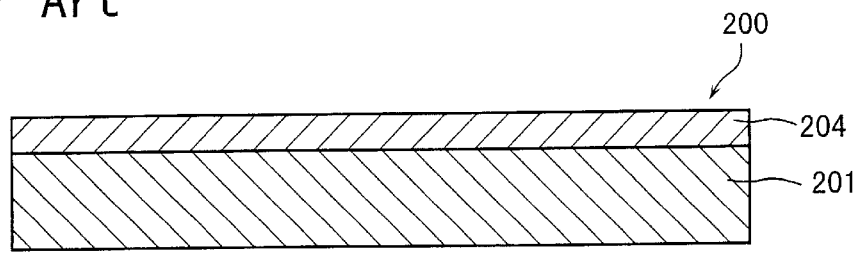
Figure 21B:
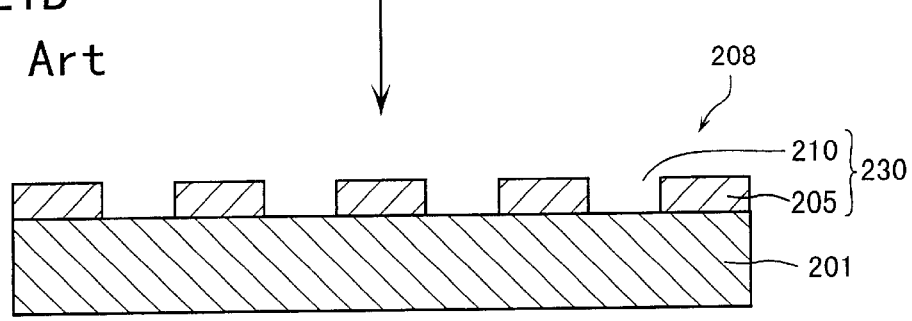
Figure 21C:
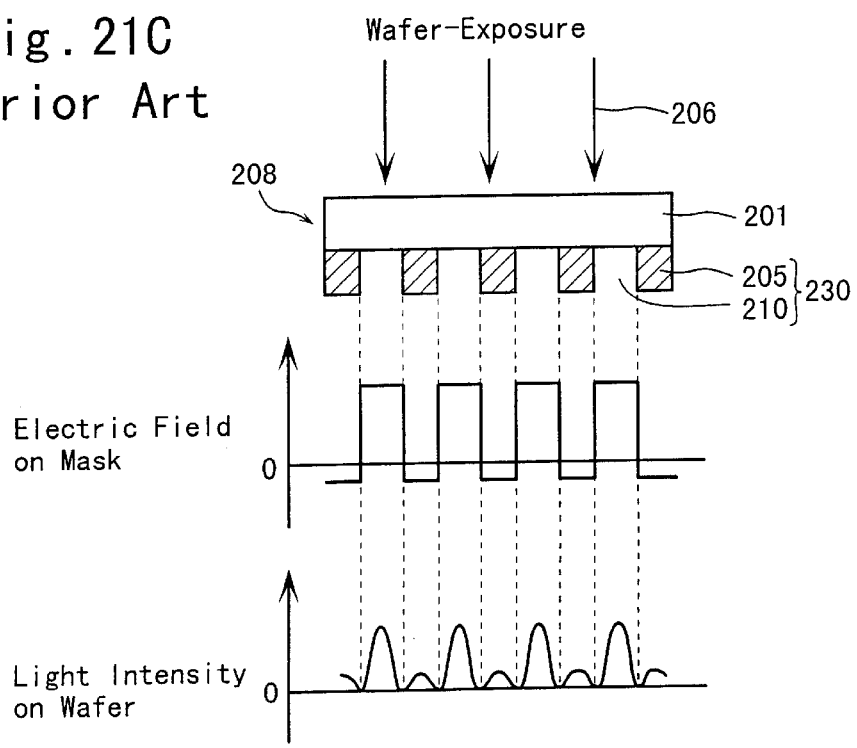

21 to 25 prepared in Example 2 as expressed in terms of the film surface reflectivity, transmittance and rate of variation of phase difference;

FIG. 17 is a graph showing the relation between the resistance to an aqueous ammonia solution and the number of film-forming steps observed for the film of Sample Nos. 31 to 35 prepared in Example 2 as expressed in terms of the film surface reflectivity, transmittance and rate of variation of phase difference;

FIG. 18 shows schematic diagrams for explaining the film-forming steps performed in Example 5, in which (A) is a cross-sectional view of a molybdenum silicide oxynitride (MoSiON) film produced in Example 5 according to the present invention; and (B) to (E) are diagrams each for explaining a part of the steps in Example 5;

FIG. 19 is a cross-sectional view of a quasi-bilayer film of molybdenum silicide oxynitride (MoSiON) produced in Example 6 according to the present invention;

FIG. 20 is a diagram for explaining a part of the steps performed in Example 6 according to the present invention;

FIGS. 21(A) to (C) are a cross-sectional view of a phase-shifting photomask blank, a cross-sectional view of a phase-shifting photomask, and a diagram for explaining the intensity of the exposed light rays observed on the surface of a wafer;

FIGS. 22(A) to (D) each is a diagram for explaining a part of the steps performed in Example 7 according to the present invention;

FIGS. 23(A) to (E) each is a diagram for explaining a part of the steps performed in Example 8 according to the present invention; and FIGS. 24(A) and (B) each is a diagram for explaining a part of the steps performed in Example 9 according to the present invention.

DETAILED DESCRIPTION OF THE PREFERRED EMBODIMENTS

In the present invention, a film is formed by passing, at least 4 times, a film-forming substrate over a target. Therefore, the resulting film has a periodic structure consisting of at least 4 non-uniform unitary films each of which is formed on the substrate by a single film-forming step, the distribution of compositions along the thickness of the thin films formed is thus substantially equalized and the resulting film would exhibit the resistance to chemicals and optical characteristics substantially identical to those observed for a uniform film.

The method for preparing a phase-shifting photomask blank according to the present invention preferably utilizes NO gas as the reactive gas, a target composed of a mixture of molybdenum and silicon as the sputtering target and a transparent substrate as the thin film-forming substrate to thus form a light-transmitting film capable of transmitting light rays having an intensity, which cannot substantially contribute to the exposure, on the transparent substrate.

Moreover, in the foregoing method, it is desirable that the method be designed in such a manner that even the regions whose deposition rate of the target component is not more than 90% of the maximum level thereof also contribute to the film-formation by forming a film through an opening having a sufficiently enlarged length along the substrate-conveying direction.

According to the present invention, a phase-shifting photomask can be prepared by producing a phase-shifting photomask blank by the foregoing production method, removing a part of the light translucent film of the blank by subjecting it to a patterning treatment to thus form a pattern consisting of the resulting light translucent portions and light-transmitting portions capable of transmitting light having an intensity which can substantially contribute to the exposure.

In the present invention, the patterning of the foregoing phase-shifting photomask blank can be performed by any light-exposure process such as light rays- or electron beam-exposure techniques. When carrying out this electron beam exposure, it is desirable that a metallic antistatic film be deposited directly on a shifter film formed on the substrate and then a resist for electron beam exposure be applied thereon prior to the electron beam exposure or that a resist for electron beam exposure be formed on a phase-shifter film (or a metallic antistatic film is applied onto the phase-shifter film and then a resist for electron beam exposure be applied thereon) and then a non-metallic antistatic film be formed thereon. This is because if a film free of any electrical conductivity such as a molybdenum silicide oxynitride film is used as the phase-shifter film and the phase-shifter film is subjected to the electron beam exposure without any pre-treatment, the phase-shifter film would cause static electrification and accordingly, such an antistatic film is applied in advance. As such antistatic films, there may be used, for instance, non-metallic antistatic films such as Espacer 100 and 300 (registered trade marks in Japan) available from Showa Denko K.K. and aqua SAVE-53za available from Nitto Chemical Industry Co., Ltd.; and metallic antistatic films such as those comprising Mo, Cr, W, Ta, Ti, Si, Al or the like, or alloys thereof.

In addition, the device for manufacturing the phase-shifting photomask blank according to the present invention has been developed for practicing the foregoing method of the present invention and in particular, the device is designed in such a manner that even the regions whose deposition rate of the target component is not more than 90% of the maximum level thereof also contribute to the film-formation by sufficiently enlarging the length of the opening along the substrate-conveying direction.

The present invention will hereinafter be described in more detail with reference to Examples and Comparative Examples as well as the accompanying drawings. These Examples are given only for the illustration of the present invention and are not to be construed as limiting the scope of the present invention.

Figure 1:
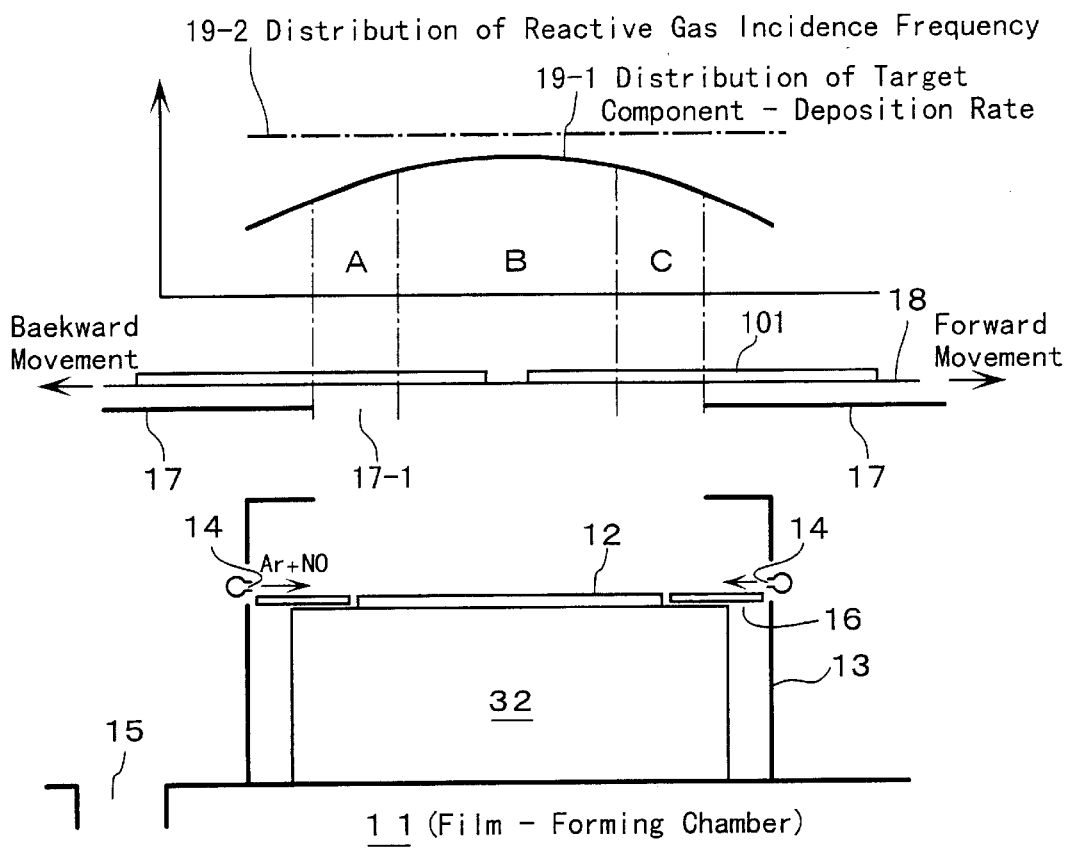
FIG. 1 is a schematic partial diagrammatic view for explaining the film-forming chamber of a film-forming device used in the present invention.

First of all, the present invention will be described in detail with reference to FIGS. 1 to 5 attached hereto. FIG. 1 shows a part of the film-forming chamber 11 of a film-forming device. This device comprises two cathodes having the same structure and positioned in proximity to one another and either of them can be used, but only one 32 of these depicted cathodes is used in the following description for the sake of simplicity, unless otherwise specified. After exhausting the film-forming chamber 11 to a vacuum, a gas mixture of a sputtering gas and a reactive gas is supplied to the chamber through a gas supply port 14. A DC voltage which is negative relative to the grounding voltage is applied to a sputtering target 12 (MoSi). Thus, a discharge zone is established in the proximity to the sputtering target and as a result, a target material is discharged from the sputtering target 12. When film-forming quartz substrates 101 are continuously conveyed in the chamber along a conveying path 18 positioned at a predetermined distance from the sputtering target 12, a unitary film (a film formed by a single pass) is formed on the substrate every passage of the substrate through an opening 17-1 of a shielding plate 17. In FIG. 1, the length of the opening 17-1 is adjusted to one approximately identical to that of an opening of a chimney 13, but the latter may be shorter than the former. In any case, it is sufficient that these openings are designed in such a manner that even the regions whose deposition rate of the target material is not more than 90% of the maximum level thereof can also contribute to the film-formation by sufficiently enlarging the length of the opening along the substrate-conveying direction. In FIG. 1, the reference numeral 16 means grounding shield.

As will be clear from the distribution 19-1 of the target component-deposition rate (or the thickness distribution of the target component in the film formed on a substrate at rest) as shown in FIG. 1, the target component is non-uniformly distributed along the conveying path 18. Therefore, if it is assumed that the frequency of the reactive gas incident upon the substrate 101 is approximately constant along the conveying path 18 as shown by a curve 19-2, the higher the target component-deposition rate along the conveying path 18, the greater the amount of the unreacted target component and thus the content of the reaction product in the resulting film is reduced and this leads to the formation of a non-uniform film on the conveyed substrate.

Figure 2:
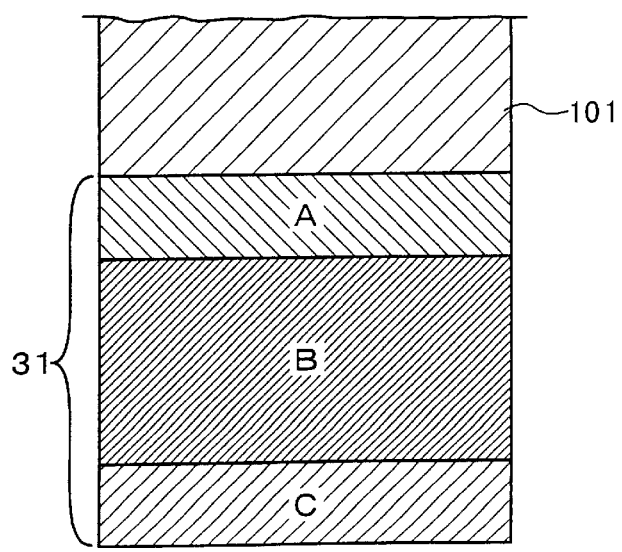
FIGS. 2 to 5 are diagrams for explaining various film-forming processes used in Examples of the present invention.
Figure 3:
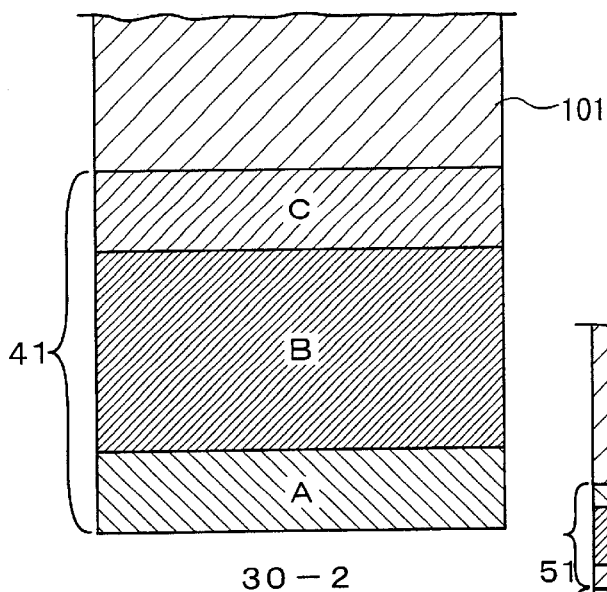

If the opening 17-1 of the shielding plate 17 is divided into three zones A, B and C along the conveying path 18, a non-uniform film denoted by the reference numeral 31 in FIG. 2 is formed on the substrate 101 by a single forward movement of the substrate 101 in a horizontal direction. Similarly, a non-uniform film denoted by the reference numeral 41 in FIG. 3 is formed on the substrate 101 by a single backward movement of the substrate 101 in the horizontal direction.

Figure 4:
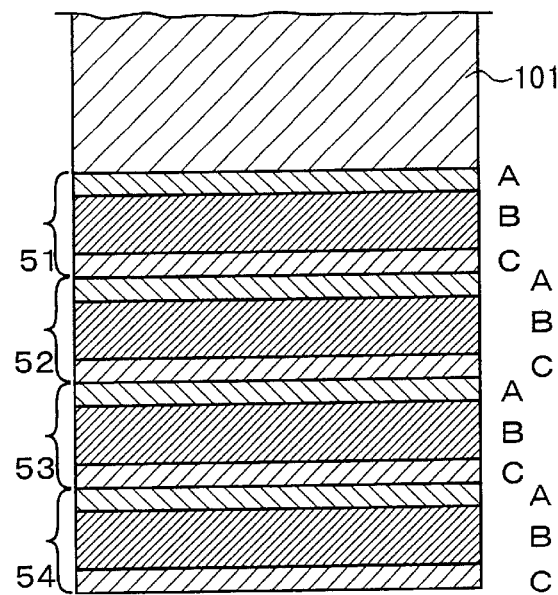
Figure 5:
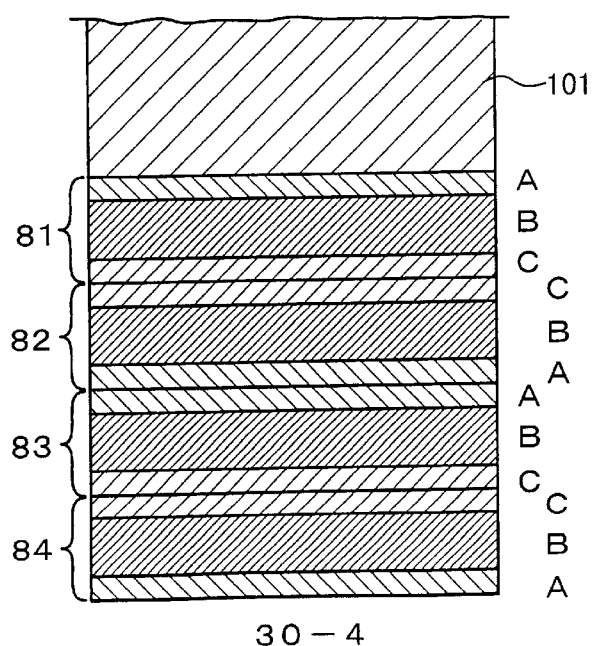

A film having a periodic structure (comprising film-constituting elements 51 to 54) as shown in FIG. 4 is formed by repeating the forward movement 4 times, i.e. by moving the substrate forth for 4 times, while if a film is formed by alternatively repeating the forward movement and backward movement 4 times in all, i.e. by moving the substrate back and forth for 2 times (one forward and backward movement cycle is repeated 2 times), a film having a periodic structure (comprising film-constituting elements 81 to 84) as shown in FIG. 5 is obtained.

The present invention will be detailed below with reference to the following Examples, but the present invention is not restricted to these specific Examples at all and it is possible to envisage other variations thereon without departing from the scope of the invention.

EXAMPLE 1

Table 1 shows conditions for manufacturing a variety of samples which are films each having a periodic structure formed by the forward movement or the forward or backward movements according to the foregoing procedures. Sample No. 1 is a film formed by a single forward movement of the substrate and Sample Nos. 2, 3, 4 and 5 are films formed by repeating the forward and backward movements 2, 3, 4 and 6 times, respectively. Sample No. 2 corresponds to the film having a layer structure as shown in FIG. 5 and comprises a non-uniform film, whose film-constituting elements are represented by the reference numerals 81 to 84, formed on the substrate 101.

Table 2 shows the results obtained by inspecting each sample listed in Table 1 for film thickness, i-line phase difference, spectral reflectance and spectral transmittance.

Table 3 shows i-line optical constants (refractive index (n) and extinction coefficient (k)) determined by the so-called RT method based on the measured results listed in Table 2 together with the phase difference calculated from the optical constants thus obtained and the film thickness for the purpose of comparison with the practically measured values.

Figure 6:
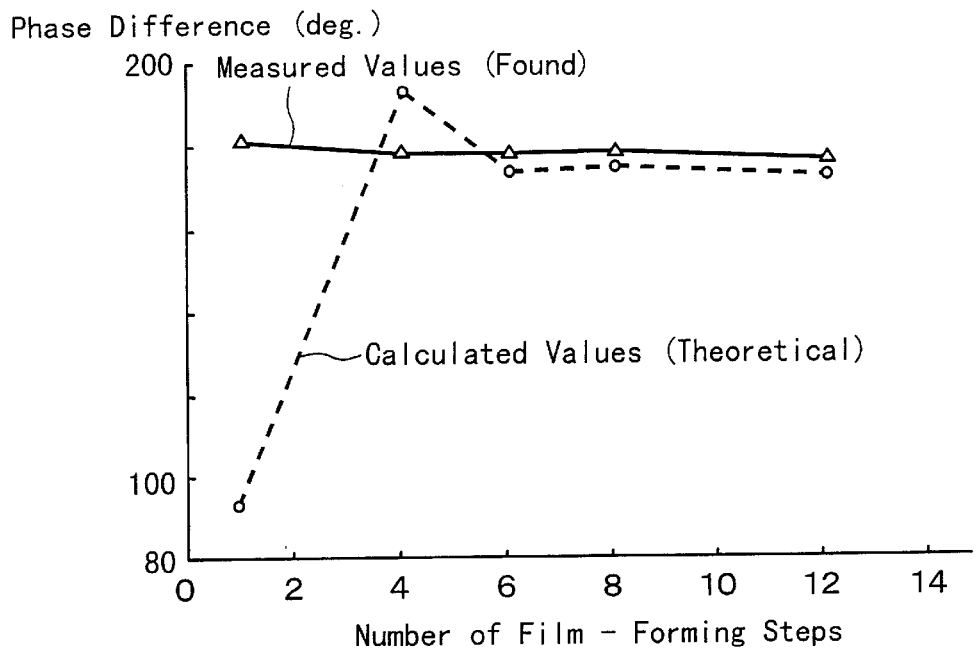
FIG. 6 is a graph showing the relation between the phase difference and the number of film-forming steps observed for the thin film prepared in Example 1.

FIG. 6 is a graph showing the measured phase difference values while comparing them with those calculated from the optical constants and the film thickness as shown in Table 3. In FIG. 6, the phase difference (deg.) is plotted as ordinate and the number of film-forming steps as abscissa.

Figure 7:
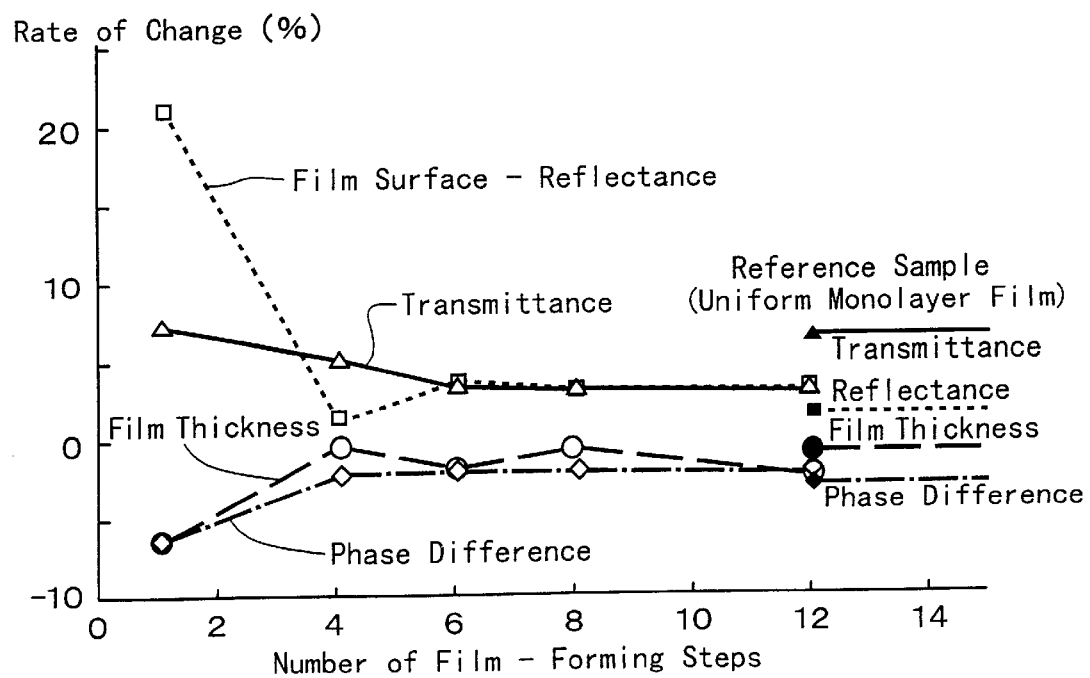
FIG. 7 is a graph showing the relation between the resistance to an aqueous ammonia solution and the number of film-forming steps observed for the thin film prepared in Example 1 as expressed in terms of the film thickness, film surface reflectivity, transmittance and rate of variation of phase difference.

FIG. 7 is a graph showing the results obtained in the 90 minute-immersion test wherein the samples listed in Table 1 and Sample No. 26 (reference example) listed in Table 7 were immersed in a 0.5% aqueous ammonia for 90 minutes.

In FIG. 7, the rates of change (%) in the transmittance, phase difference, film thickness and reflectance observed when light rays are incident upon the surface of a film (hereinafter referred to as "film surface-reflectance") are plotted as ordinate and the number of film-forming steps as abscissa. The transmittance, phase difference and film surface-reflectance are those determined using light rays having a wavelength A of 365 nm. In this respect, the rate of change (%) is defined by the following equation:

$$\text{Rate of Change } (\%)=[(V_m-V_{in})/V_{in}]\times 100 \quad (1)$$

wherein $V_{im}$ represents the value observed after the immersion, $V_{in}$ represents the value observed prior to the immersion.

FIGS. 8 to 11 each is a diagram showing the results obtained by analyzing the film composition of Sample No. 1, 2 or 4 or Sample No. 26 (reference example) listed in Table 7, using an Auger electron spectrometer. In these figures, the content of each element (arbitrary scale) is plotted as ordinate and the sputtering time (min), i.e. the position in the direction along the thickness, as abscissa. In this respect, Sample No. 26 is a uniform film formed using the usual batch type film-forming device and is given for the purpose of comparison.

Figure 10:
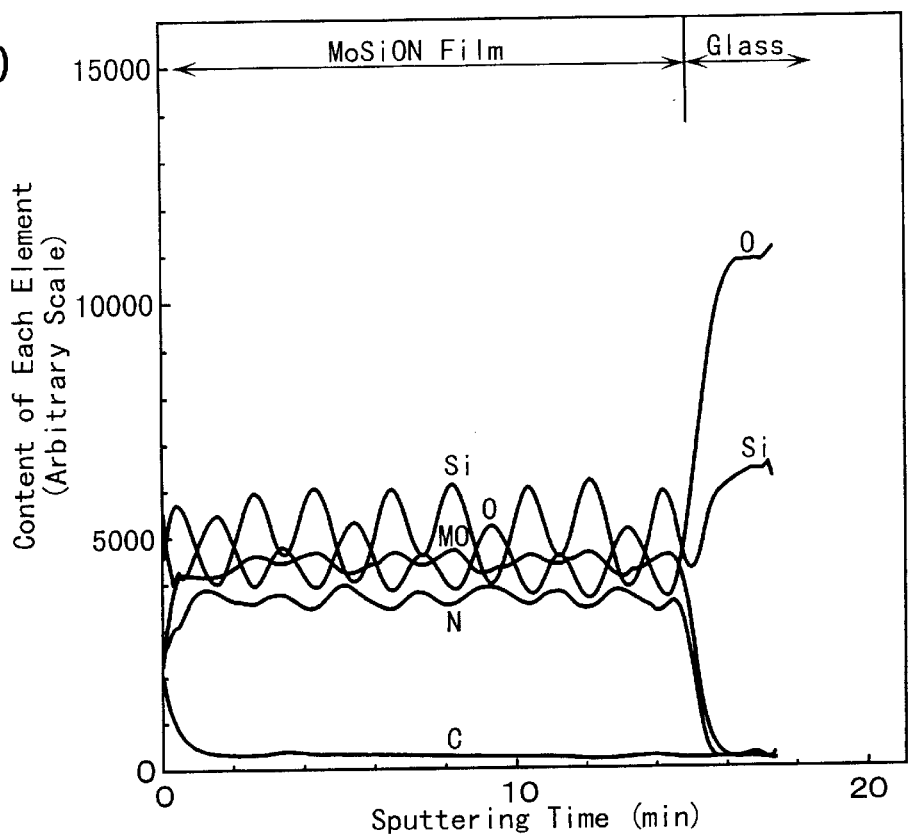
FIG. 10 is a diagram showing the results obtained by analyzing the film composition of the sample No. 4 prepared in Example 1, using an Auger electron spectrometer.
Figure 11:
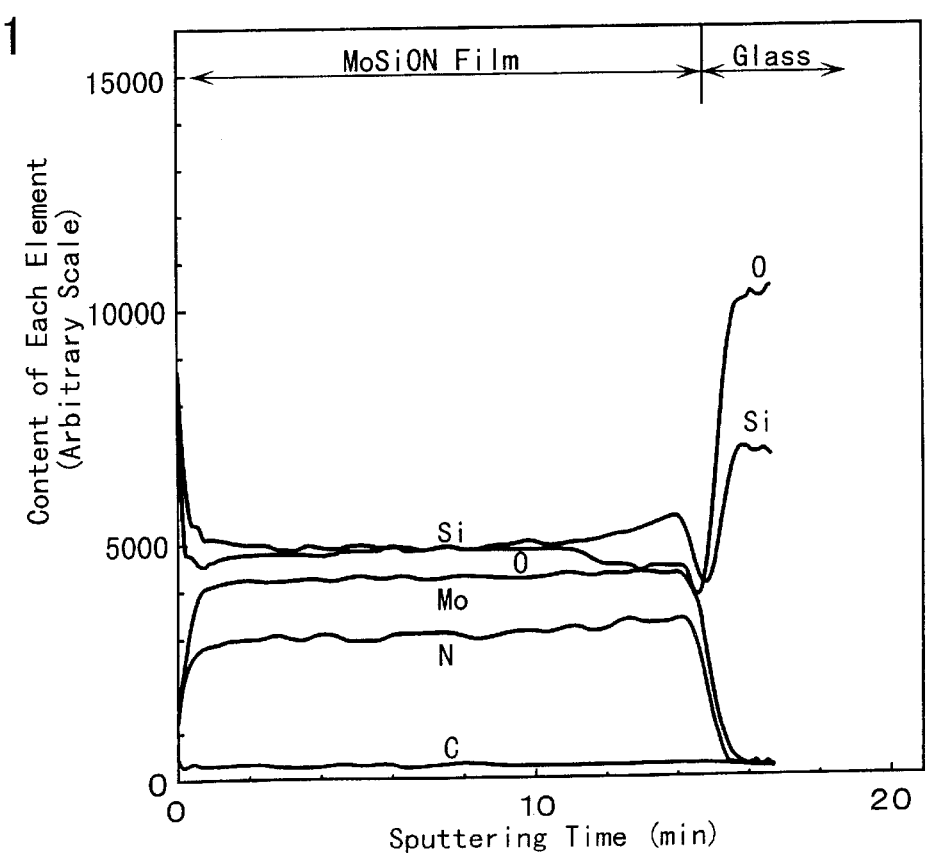
FIG. 11 is a diagram showing the results obtained by analyzing the film composition of a uniform film sample No. 26 (reference sample) given in Example 7 for the purpose of comparison, using an Auger electron spectrometer.

The results plotted on FIGS. 8, 9 and 10 clearly indicate that the film composition can be equalized in the direction of the film thickness as the number of film-forming steps increases. The results listed in Table 3 and plotted on FIG. 6 indicate that the phase difference values as calculated on the basis of such an assumption that the film is a uniform monolayer one approach the practically measured ones as the number of film-forming steps increases and this clearly reflects the fact that the film composition is equalized in the direction of the film thickness along with the number of film-forming steps.

Figure 12:
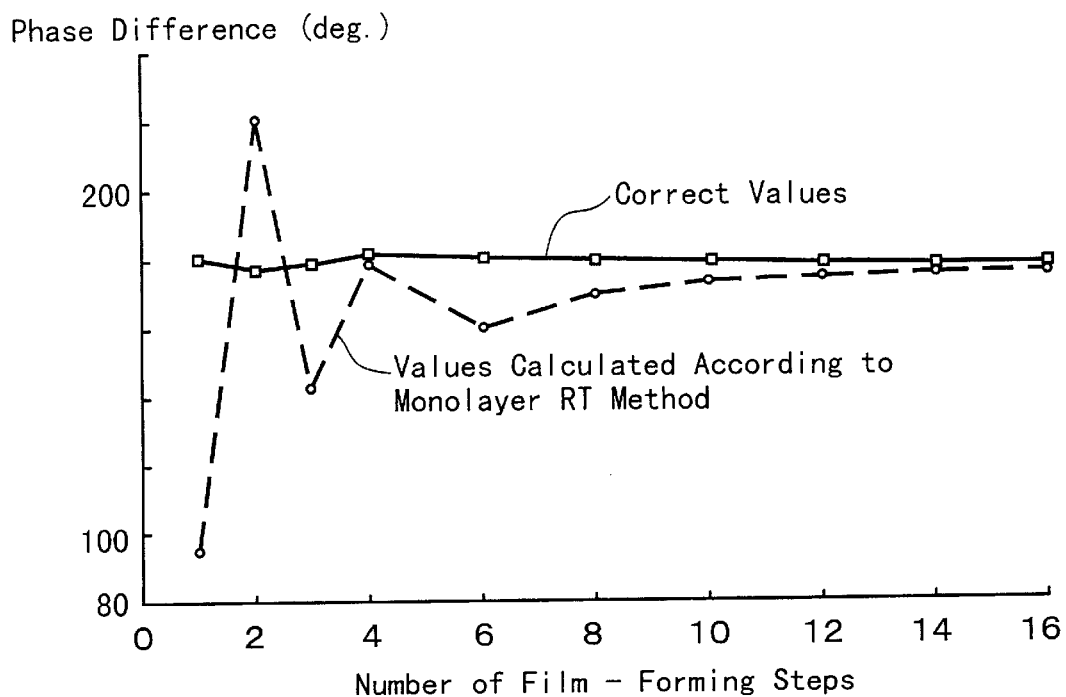
FIG. 12 is a graph showing the relation between the phase difference and the number of film-forming steps observed for the thin film prepared in Example 1.
Figure 13:
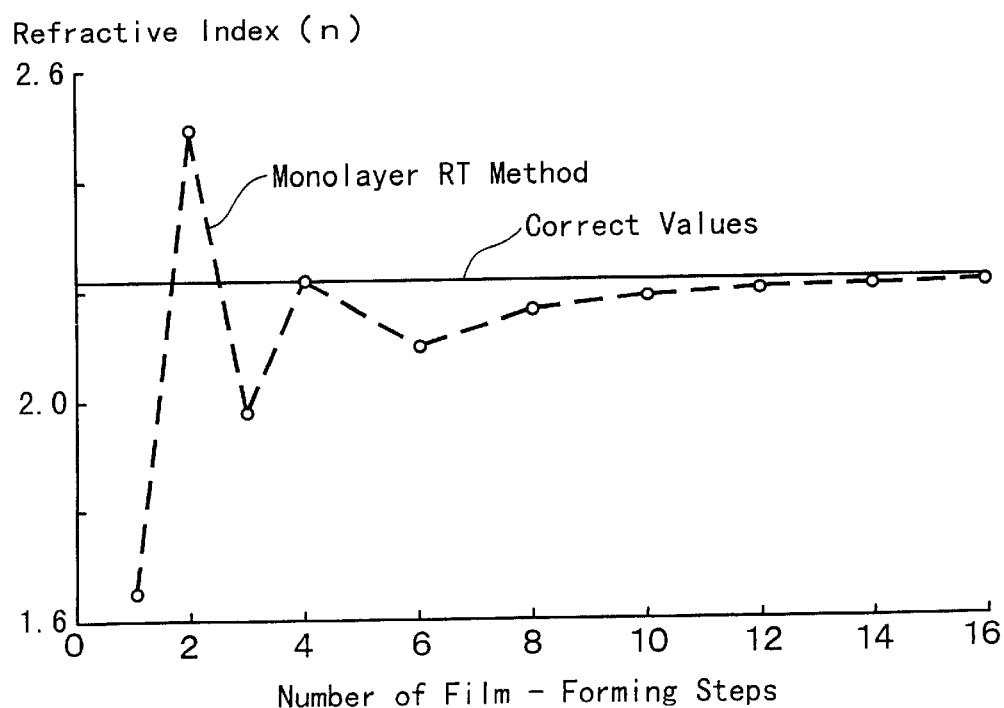
FIG. 13 is a graph showing the relation between the refractive index and the number of film-forming steps observed for the thin film prepared in Example 1.
Figure 14:
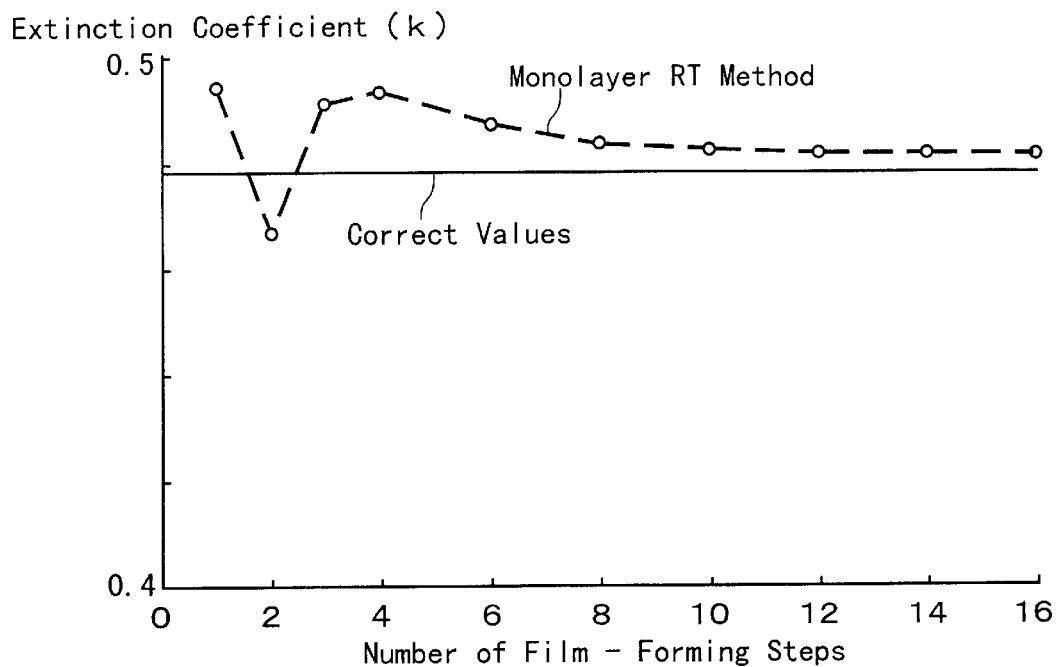
FIG. 14 is a graph showing the relation between the extinction coefficient and the number of film-forming steps observed for the thin film prepared in Example 1.

To clarify this fact, the non-uniform film shown in FIG. 8 is assumed to be one comprising three layers as shown in FIG. 2 for the sake of simplification and each layer is assumed to be a uniform one having a composition represented by A, B or C. More specifically, assuming that the film formed by the combination of the forward and backward movements as used shown in FIGS. 9 and 10 be constituted by three layers of uniform films which are formed by each single passage (i.e. 1 forward or backward movement) like the non-uniform film as shown in FIG. 5 and further that films have a variety of structures shown in Table 4 corresponding to the samples listed in Table 1, the reflectance, transmittance, phase difference or the like are calculated for these films. Table 5 shows the results obtained by the calculation. More specifically, Table 5 shows the optical constants and phase difference which are compared with one another and which are calculated by the RT method while assuming that each film is a uniform monolayer one although it is practically a non-uniform film. FIGS. 12, 13 and 14 are graphs showing the results listed in Table 5. The results plotted on these figures clearly indicate that the optical constants and phase difference values which are calculated on the basis of the supposition that each sample is a uniform monolayer film tend to approach the correct values as the number of film-forming steps increases. In FIG. 12, data are plotted so that they correspond to those plotted on FIG. 6.

The data plotted on FIG. 7 clearly indicate that the resistance to chemicals of the sample, which is prepared by repeating film-forming steps over less than 4 times, as determined by a test wherein the sample is immersed in a 0.5% aqueous ammonia is considerably inferior to that observed for the sample prepared by repeating the film-forming steps over not less than 4 times.

This is because the film formed comprises a considerably thick layer of molybdenum silicide oxynitride, which is susceptible to aqueous ammonia, formed on the film if the number of film-forming steps is small, as shown in FIG. 8 and if the layer is eroded by aqueous ammonia, the whole of the film is greatly affected by the erosion.

If the number of film-forming steps increases, the resistance to chemicals (in this case, aqueous ammonia) of the resulting film would be improved as will be seen from the data plotted on FIGS. 9 and 10, since the entire film is only slightly affected by the erosion of the oxynitride layer present on the film with aqueous ammonia because of the small thickness of the oxynitride layer as compared with that of the entire film and in other words, a layer having a small content of oxynitride and having high resistance to aqueous ammonia is exposed when the surface layer of the film is eroded and the erosion does not proceed any further and does not reach the interior of the film.

EXAMPLE 2

Table 6 shows conditions for producing a variety of samples each having a periodic structure. The samples were produced by repeating the forward movement of the substrate using a sputtering device which differs from that used in Example 1, but has a construction identical to that shown in FIG. 1 and can undergo the same operations as shown in FIG. 1. The structures of the sample Nos. 21 and 22 correspond to those shown in FIGS. 2 and 4 respectively. Sample Nos. 23, 24 and 25 are those produced by repeating the film-forming steps over 8, 10 and 12 times (the forward movements), respectively. Sample Nos. 31 to 35 are films produced under the same conditions used for producing the sample Nos. 21 to 25 respectively, except for conditions for annealing.

Table 7 shows the results obtained by inspecting the samples listed in Table 6 for the film thickness, i-line phase difference, spectral reflectance and spectral transmittance.

Table 8 shows i-line optical constants determined by the so-called RT method based on the measured results shown in Table 7 together with the phase difference values calculated from the optical constants thus obtained and the film thicknesses for the purpose of comparison with the practically measured values.

Figure 15:
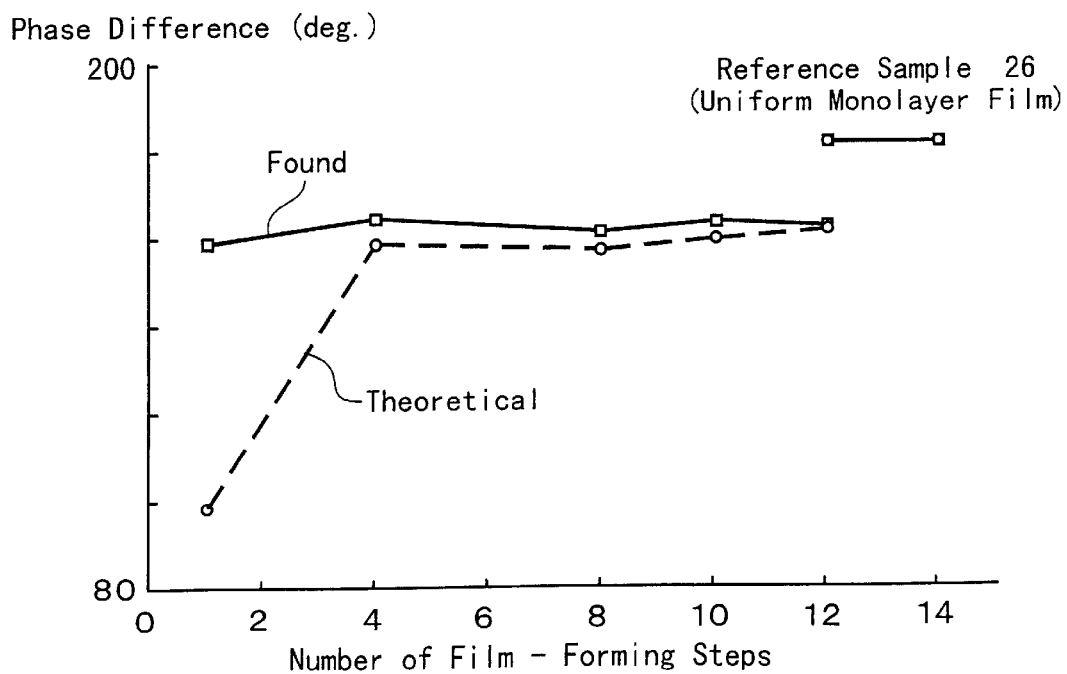
FIG. 15 is a graph showing the relation between the phase difference and the number of film-forming steps observed for the thin film prepared in Example 2.

FIG. 15 is a graph showing the phase difference values shown in Table 8 and calculated from the optical constants of the film based on the production conditions listed in Table 6 and the film thicknesses while comparing these values with the practically measured results. In FIG. 15, the phase difference is plotted as ordinate and the number of film-forming steps as abscissa.

Figure 16:
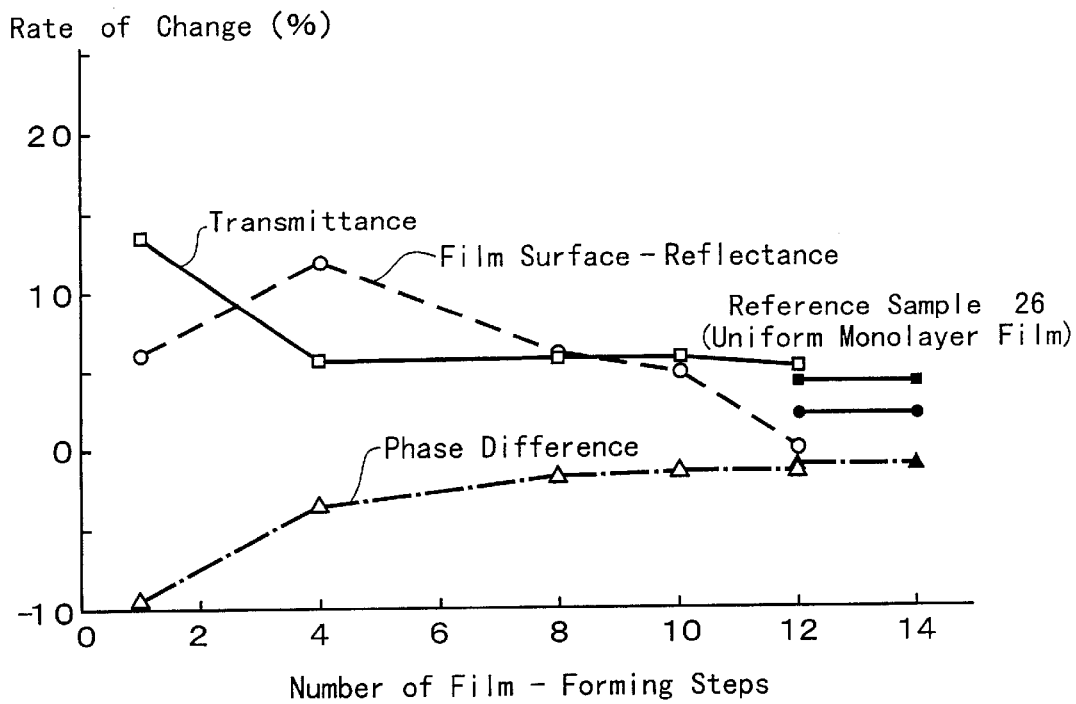
FIG. 16 is a graph showing the relation between the resistance to an aqueous ammonia solution and the number of film-forming steps observed for the film of Sample Nos.

FIGS. 16 and 17 each is a graph showing the results obtained in the 90 minute-immersion test wherein the samples Nos. 21 to 25 and the sample is Nos. 31 to 35 listed in Table 6 were immersed in a 0.5% aqueous ammonia for 90 minutes. In these figures, the rates of change (%) in the transmittance, phase difference and film surface-reflectance are plotted as ordinate and the number of film-forming steps as abscissa. In this respect, the rate of change (%) is defined by the foregoing equation (1).

As has been described above, it would be expected from the results shown in FIGS. 8, 9 and 10 that the film composition is equalized in the direction of the film thickness as the number of film-forming steps increases. The results listed in Table 8 and plotted on FIG. 15 indicate that the phase difference values as calculated on the basis of such an assumption that the film is a uniform monolayer one approach the practically measured ones as the number of film-forming steps increases. This clearly reflects the fact that the film composition is equalized in the direction of the film thickness along with the number of film-forming steps.

These optical properties observed in this case can be explained in the same way as has already been discussed above in Example 1.

The result plotted on FIG. 16 clearly indicate that the resistance to chemicals of the sample, which is prepared by repeating the film-forming steps over less than 4 times, as determined by a test wherein the sample is immersed in a 0.5% aqueous ammonia is considerably inferior to that observed for the sample prepared by repeating the film-forming steps over not less than 4 times. The resistance to chemicals can also be explained in the same way as has already been described above in Example 1.

EXAMPLE 3

Table 9 shows conditions for producing a variety of samples each having a periodic structure. The samples are produced by repeating the forward and backward movements of the substrate using the same sputtering device as used in Example 1 and shown in FIG. 1. In Table 9, the term "for 1st layer" or "for 2nd layer" appearing on the column entitled "Purpose of Film" corresponds to each layer of the quasi-bilayered film sample in Example 4 as will be detailed below. Sample Nos. 41 to 44, Sample Nos. 45 to 47, Sample Nos. 51 to 54 and Sample Nos. 55 to 56 are produced by changing the number of film-forming steps and the substrate-conveying speed in such a manner that the ratio of the former to the latter is constant in order to make the film thickness constant in each of these sample groups.

Table 10 shows the results obtained by inspecting the samples listed in Table 9, which are not annealed after the film formation, for the film thickness, phase difference (hereinafter referred to as "KrF-phase difference") observed for the KrF-excimer laser-exposure wavelength (hereinafter referred to as simply "KrF-exposure wavelength") (248 nm), i-line phase difference (365 nm), spectral reflectance and spectral transmittance.

Table 11 shows the optical constants observed for the KrF-exposure wavelength (248 nm) and i-lines (365 nm) and determined by the so-called RT method based on the measured results shown in Table 10 together with the phase difference values calculated from the optical constants thus obtained and the film thicknesses for the purpose of comparison with the practically measured values.

Table 12 shows the results obtained in a 60 minute-immersion test wherein the samples listed in Table 9 were immersed in a 0.5% aqueous ammonia for 60 minutes and those observed in a 60 minute-immersion test wherein the samples are immersed in sulfuric acid-peracid (sulfuric acid/hydrogen peroxide=1/1 (% by weight)) maintained at 100° C., in terms of the transmittance values and measured phase difference values observed before and after the treatment, and the rates of change (%) in transmittance and phase difference. In this respect, the rate of change (%) is defined by the foregoing equation (1).

The film structures of the products obtained in Example 3 and the following Example 4 approximately correspond to the uniform monolayer film and the uniform bilayer film disclosed in J.P. KOKAI No. Hei 8-74031.

As has been discussed above, it would be expected from the data shown in FIGS. 8, 9 and 10 that the film composition is equalized in the direction of the film thickness as the number of film-forming steps increases, as in Example 1. The results listed in Table 11 and obtained by analyzing the samples produced under the conditions shown in Table 9 without annealing clearly indicate that, in the sample Nos. 41 to 44, Sample Nos. 45 to 47, Sample Nos. 51 to 54 and Sample Nos. 55 to 56, the optical constants as determined from the measured results listed in Table 10 within each sample group according to the RT method and the calculated phase difference values fall within the ranges which are not affected by the number of film-forming steps. This is the result naturally expected from the data obtained in Example 1 and plotted on FIGS. 6, 12, 13 and 14 and reflects the fact that the film composition is equalized in the direction along the film thickness as the number of film-forming steps increases to thus form a uniform monolayer film and an equivalent quasi-uniform monolayer film.

These optical properties observed in this case can be explained in the same way as has already been discussed above in Example 1.

The results observed for the sample Nos. 41 to 47 for the first layer listed in Table 12 clearly indicate that the films are considerably inferior in the resistance to chemicals as determined by immersing them in a 0.5% aqueous ammonia for 60 minutes and in a sulfuric acid-peracid mixture of 100° C. for 60 minutes, even if the number of film-forming steps is not less than 8 times. This would be resulted from the film-forming conditions per se for these samples listed in Table 9 and it has been known that even a uniform film is sometimes inferior in the resistance to chemicals (see, for instance, J.P. KOKAI No. Hei 8-74031 described above).

The results observed for the sample Nos. 51 to 56 for the second layer listed in Table 12 clearly indicate that the films have practically acceptable resistance to chemicals as determined by immersing them in a 0.5% aqueous ammonia for 60 minutes and in a sulfuric acid-peracid mixture of 100° C. for 60 minutes, if the number of film-forming steps is not less than 8 times and there has also been known that the uniform films per se formed according to the film-forming conditions for these samples listed in Table 9 have good resistance to chemicals.

These films would have good resistance to chemicals for the same reason discussed above in Example 1 (see, for instance, J.P. KOKAI No. Hei 8-74031 described above).

EXAMPLE 4

Table 13 shows film-forming conditions for a variety of samples each having a periodic structure which is produced by repeating the forward and backward movements using the sputtering device used in Example 1 and shown in FIG. 1. All of the samples listed in Table 13 are films of the type shown in FIG. 5 and each film was formed by repeating the film-forming steps over 8 to 12 times. In Table 13, first and second layers listed in the column entitled "Layer" correspond to the first and second layers listed in the column entitled "Purpose of Film" in Table 9, respectively and they have almost the same film compositions as those for the latter.

Table 14 shows the results of the film thickness, KrF-phase difference, i-line phase difference, spectral reflectance and spectral transmittance determined for the samples listed in Table 13 which were not subjected to any annealing treatment after the film formation.

Table 15 shows the KrF-exposure wavelength and i-line optical constant, which were calculated on the basis of the measured results listed in Table 14 according to the so-called RT method, together with the results of comparison of the phase differences calculated from the optical constants thus determined and the film thicknesses with the values practically found.

Table 16 shows the results of the 60 minute-immersion test in a 0.5% aqueous ammonia and those of the 60 minute-immersion test in a sulfuric acid-peracid at 100° C. for each sample listed in Table 13, as expressed in terms of the transmittance values, measured phase difference values and the rates of change defined by the foregoing formula (1) as determined before and after the treatment.

The first and second layers of each sample listed in Table 13 are formed by the same method used for obtaining each corresponding layer in Example 1 or 3 and therefore, it would be expected that the film composition is uniformized in the direction along the film thickness as the number of film-forming steps increases as in Example 1. The analysis results shown in Table 14 observed for the annealing-free samples listed in Table 13 clearly indicate that the optical constants as determined by the RT method and the calculated values of phase difference lie in the area which is independent of the number of film-forming steps. This is the result necessarily predicted on the basis of the results obtained in Example 1 and shown in FIGS. 6, 12, 13 and 14 and reflects the fact that the film composition is uniformized in the direction along the film thickness as the number of film-forming steps increases to thus form a film identical to a uniform monolayer film.

The optical characteristics of this film may be explained according to the same way used for the explanation of those observed for the quasi-uniform monolayer film in Example 1 and accordingly, the details thereof are herein omitted.

It has already been discussed above in Example 3 that the sample Nos. 41 to 47 for the first layer listed in Table 12 are considerably inferior in the resistance to chemicals as determined by the 60 minute-immersion test performed using a 0.5% aqueous ammonia and the 60 minute-immersion test performed using a sulfuric acid-peracid mixture maintained at 100° C., even if the number of film-forming steps is not less than 8 times, while the sample Nos. 61 to 67 of this Example exhibit practically acceptable resistance to chemicals as will be seen from the data listed in Table 16. This can be interpreted as follows: the first layer of each sample in this Example is inferior in the resistance to chemicals, but the first layer is protected by a film having the same quality as that of the second layer of the sample Nos. 51 to 56 listed in Table 12, which has good resistance to chemicals as has been discussed above in Example 3 (see, for instance, J.P. KOKAI No. Hei 8-74031 described above).

EXAMPLE 5

A phase-shifting photomask blank having the same structure as shown in FIG. 18(A) was prepared by forming a phase-shifter film, on a transparent quartz substrate, having a thickness of 150 nm, an i-line phase difference of about 180 deg. and a transmittance of 6% under approximately the same film-forming conditions as those described above in Example 1 in connection with the sample No. 4 listed in Table 1 according to the same method as used in Example 1. The resulting phase-shifting photomask blank comprises a molybdenum silicide oxynitride film (MoSiON) 104 deposited on the quartz substrate 101.

Then a resist for electron beam-exposure (such as ZEP-810S (registered trade mark in Japan), available from Nippon Zeon Co., Ltd.) was applied onto the molybdenum silicide oxynitride film 104 as shown in FIG. 18(B), while using the resulting phase-shifting photomask blank to thus give a resist film 105 having a thickness of 5000 nm. Moreover, the molybdenum silicide oxynitride film does not possess any electrical conductivity and is accordingly charged when subjecting it to electron beam-exposure without any treatment. For this reason, a nonmetallic antistatic film 106 (Espacer 100 (registered trade mark in Japan), available from Showa Denko K.K.) was formed in a thickness of about 100 Å on the oxynitride film.

Thereafter, the resist film was subjected to electron beam-exposure, followed by removal of the foregoing antistatic film 106 through water-washing and simultaneous development of the resist film 105 as shown in FIG. 18(C) to thus form a resist pattern 107.

The foregoing phase-shifting film 104 was etched, through the foregoing resist pattern 107 as a mask, by reacting the film with a mixture of $CF_4$ gas (flow rate: 100 sccm) and $O_2$ gas (flow rate: 5 sccm) as a reactive gas in a parallel plate RF ion etching system operated under conditions of an electrode—electrode space of 60 mm and a working pressure of 0.4 Torr for 3 minutes to thus form, on the quartz substrate 101, a circuit pattern 108 to be transferred onto a semiconductor substrate, as shown in FIG. 18(D). Then the foregoing resist pattern 107 was removed to give a phase-shifting photomask 115 having a structure as shown in FIG. 18(E).

EXAMPLE 6

A phase-shifting film having a thickness of 150 nm was formed on a transparent quartz substrate under approximately the same film-forming conditions as those described above in Example 4 in connection with the sample No. 65 listed in Table 13 according to the same method as used in Example 4 and then annealed at 350° C. for 3 hours to thus form a phase-shifting photomask blank having the structure shown in FIG. 19 and having a KrF-phase difference of about 180 deg. and a transmittance of 6%. The resulting phase-shifting photomask blank comprises a molybdenum silicide oxynitride (MoSiON) films 104 (first layer) and 102 (second layer) deposited on the quartz substrate 101.

Then a phase-shifting photomask 215 having a circuit pattern 108' as shown in FIG. 20 was prepared from the resulting phase-shifting photomask blank according to the same method as used in Example 5. The phase-shifting photomask 215 thus prepared comprises a first MoSiON film 104' and a second MoSiON film 102' deposited on the quartz substrate 101 as well as an opening 110.

EXAMPLE 7

Figure 22A:
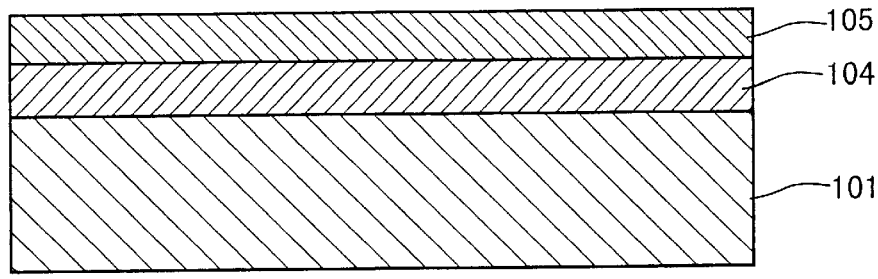

There was first formed a phase-shifting photomask blank which comprised a molybdenum silicide oxynitride (MoSiON) film as a phase shifter film 104 deposited on a quartz substrate 101 according to the same method as used in Example 5, as shown in FIG. 22(A) and then a resist film 105 (in this case, a photoresist film) was formed on the phase shifter film 104 in a thickness of about 5000 Å.

Figure 22B:
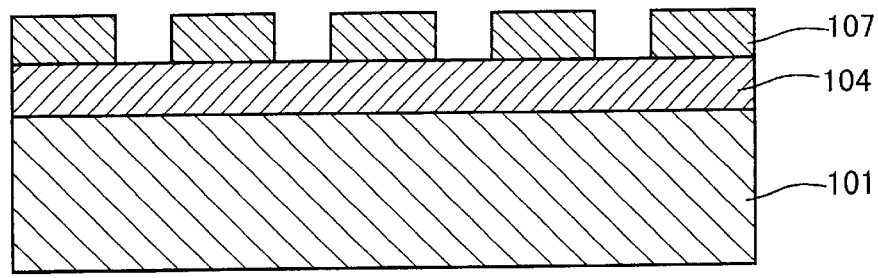

Then, the resist film 105 was exposed to i-lines, followed by development of the resist film 105 as shown in FIG. 22(B) to give a resist film 107 carrying a desired resist pattern.

Figure 22C:
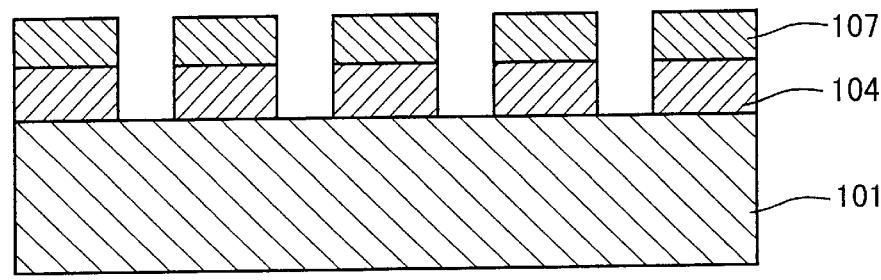
Figure 22D:
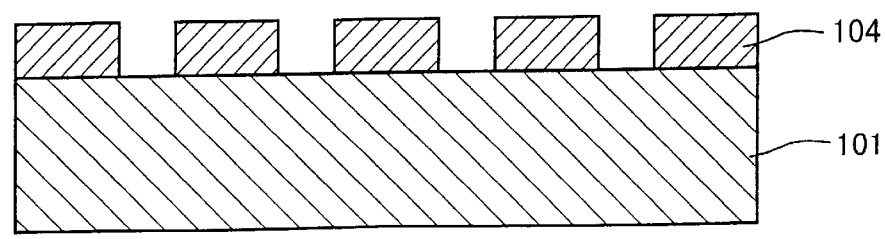

Thereafter, a phase-shifting photomask 115 having a structure as shown in FIG. 22(D) was prepared by subjecting the phase shifter film 104 to RF ion etching through the foregoing resist film 107 as a mask in the same manner as used in Example 5 and then removing the resist pattern 107 as shown in FIG. 22(C).

EXAMPLE 8

Figure 23A:
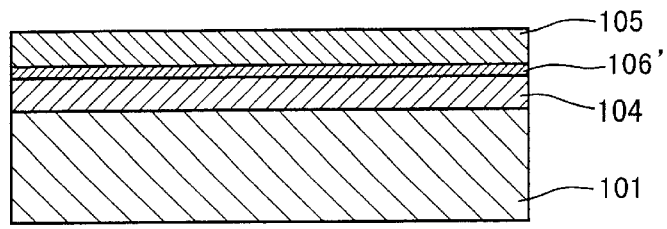

In this Example, the steps for the manufacture of a phase-shifting photomask will be described while referring to the accompanying FIGS. 23(A) to 23(E). First, a phase-shifting photomask blank having a structure as shown in FIG. 23(A) was prepared according to the same method as used in Example 5. More specifically, a metallic antistatic film 106' which consisted of a molybdenum film having a thickness of about 100 to 500 Å was formed on a phase-shifter film 104 deposited on a quartz substrate 101 and then a resist film 105 for electron beam-exposure was formed on the metallic antistatic film 106' in a thickness of 5000 Å. The molybdenum film was formed according to the usual DC magnetron sputtering method using a molybdenum target. This is because the phase-shifter film 104 does not have electrical conductivity.

Figure 23B:
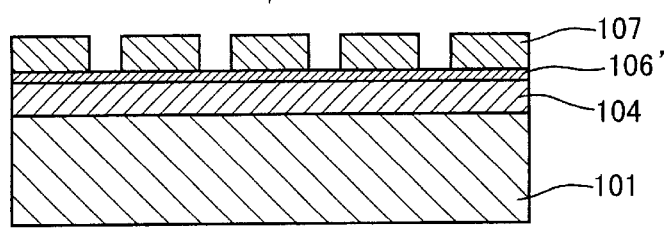

Then, as shown in FIG. 23(B), the desired portions of the resist film 105 was subjected to electron beam-exposure, followed by development thereof to form a resist film 107 carrying a desired resist pattern.

Figure 23C:
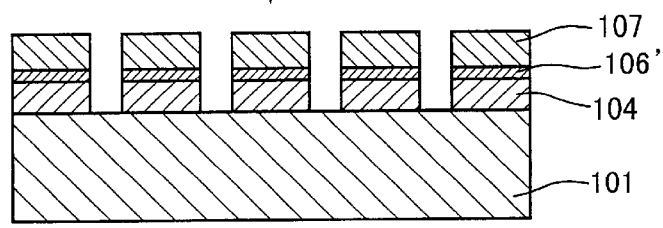

Thereafter, the metallic antistatic film 106' and the phase-shifter film 104 were subjected to RF ion etching through the resist film 107 for electron beam-exposure as a mask according to the same method as used in Example 5, as shown in FIG. 23(C).

Figure 23D:
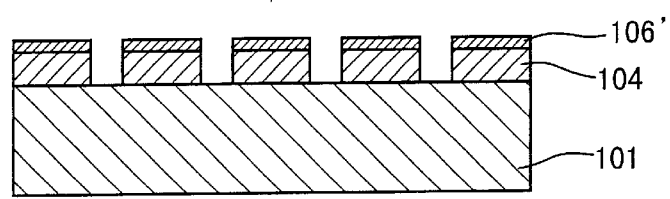
Figure 23E:
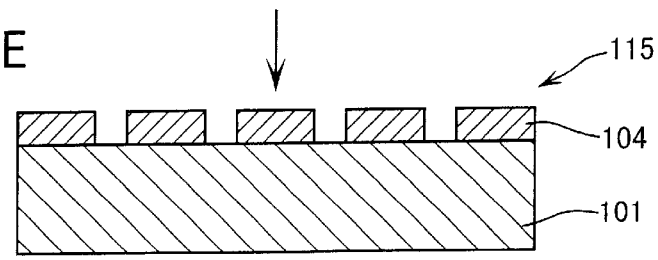

Next, the resist film pattern 107 was removed by, for instance, the $O_2$ plasma etching technique as shown in FIG. 23(D), followed by removal of the metallic antistatic film 106' by etching the film with an etching liquid ($H_2SO_4$+ $H_2O_2$) as shown in FIG. 23(E) to thus give a phase-shifting photomask 115 having a structure shown in FIG. 23(E).

EXAMPLE 9

A resist film 105 was formed according to the same method as used in Example 8 and then a nonmetallic antistatic film 106 (aqua SAVE-53za, available from Nitto Chemical Industry Co., Ltd.) was formed on the resist film 105 in a thickness of about 500 to 1000 Å, prior to the electron beam exposure, as shown in FIG. 24(A). Thereafter, the resist film was exposed to electron beam, followed by removal of the nonmetallic antistatic film 106 through water-washing simultaneous with the development of the resist film 105 to give a resist pattern 107 as shown in FIG. 24(B). Then the same procedures as shown in FIGS. 23(B) to 23(E) and used in Example 8 were repeated to form a phase-shifting photomask 115.

In the foregoing Examples, only one cathode 32 of the film-forming device was used, but another cathode (not shown) adjacent to the cathode 32 and having the same structure as that of the latter may simultaneously be used so that a substrate passes over these two cathodes during a single film-forming step. Moreover, only one cathode 32 was used also in Examples 3 and 4, but a cathode other than the cathode 32 may be used in such a manner that the first film as shown in Tables 9 and 10 is, for instance, formed using one cathode 32, while the second film is formed using the other cathode.

In the foregoing Examples, molybdenum is used as a constituent element or metal for the substance constituting the phase-shifting portion of the optically semitransparent part, but the constituent element is not restricted to the same and may be those commonly used in this field such as Ta or W.

In the foregoing Examples 7 to 9, only the phase-shifter having the monolayered structure as shown in FIG. 18(A) was described, but those having a bi-layer structure as shown in FIG. 19 may likewise be used without any problem.

In Examples 8 and 9, a molybdenum film was used as the metallic antistatic film 106'. However, the latter is not limited to the former and may be any other metal film which can ensure the achievement of the same effect such as films of, for instance, Cr, W, Ta, Ti, Si, Al and alloys thereof.

In the foregoing Examples, argon gas was used as the inert gas. However, the inert gas may be any inert gas other than argon such as helium, neon, krypton and xenon. In addition, NO gas was used as the reactive gas, but it is also possible to use $N_2O$ gas or a mixed gas comprising $N_2$ gas and $O_2$ gas.

In the foregoing Examples, the quartz substrate was used as a substrate for forming films, but it is a matter of course that the other transparent substrates may be used instead.

According to the present invention, a film is formed by passing a substrate for film-formation over a target at least 4 times and this permits the formation of a thin film having a periodic structure which consists of at least 4 unitary nonuniform films each formed, on the substrate, through a single film-forming step. More specifically, the present invention permits the formation of a substantially uniform film which has optical characteristics quite similar to those which would be observed for the uniform monolayer film and which has resistance to chemicals substantially comparable to that observed for the uniform film, without sacrificing or impairing the utilization efficiency of the target and the productivity rate. In other words, the resulting film of the present invention having a periodic structure can substantially be handled as a monolayer film, this makes the calculation of optical constants, film design and quality control of the film quite easy and accordingly, the present invention makes the production of a phase-shifting photomask blank and phase-shifting photomask quite easy.

TABLE 1

(Example 1: Forward Movement and Forward and Backward Movements)

| Sample No. | Ar Flow Rate SCCM | NO Flow Rate SCCM | Film-Forming Pressure mTorr | Sputtering Current A | Sputtering Voltage V | Number of Film-Forming Steps | Conveying Speed mm/min | Annealing Conditions | Remark |
|---|---|---|---|---|---|---|---|---|---|
| 1 | 80 | 35 | 4.2 | 1.5 | (~450) | 1 | 90 | 250° C., 1 hr | 1 Forward Movement |
| 2 | 80 | 35 | 4.2 | 1.5 | " | 4 | 90 × 4 = 360 | 250° C., 1 hr | 2 Forward and Backward Movements |
| 3 | " | " | " | " | " | 6 | 90 × 6 = 540 | " | 3 Forward and Backward Movements |
| 4 | " | " | " | " | " | 8 | 90 × 8 = 720 | " | 4 Forward and Backward Movements |
| 5 | " | " | " | " | " | 12 | 90 × 12 = 1080 | " | 6 Forward and Backward Movements |

TABLE 2

(Example 1: Optical Characteristic Properties; Annealing at 250° C. for one hour; Forward Movement and Forward and Backward Movements)

| Sample No. | Film Thickness nm | i-Line Phase Difference deg. | Wavelength | nm | 240 | 248 | 260 | 350 | 365 | 380 | 420 | 436 | 450 |
|---|---|---|---|---|---|---|---|---|---|---|---|---|---|
| 1 | 152.5 | 180.41 | Reflectance | % | 10.24 | 10.33 | 10.42 | 10.34 | 10.69 | 11.19 | 12.57 | 12.89 | 13.0 |
|  |  |  | Transmittance | % | 0.5 | 0.7 | 1.0 | 5.6 | 6.9 | 8.1 | 11.3 | 12.6 | 13.7 |
| 2 | 152.5 | 178.01 | Reflectance | % | 21.13 | 21.18 | 21.12 | 17.86 | 17.77 | 17.99 | 19.45 | 20.00 | 20.33 |
|  |  |  | Transmittance | % | 0.5 | 0.6 | 0.9 | 5.0 | 6.0 | 7.1 | 10.0 | 11.1 | 12.1 |

TABLE 2-continued (Example 1: Optical Characteristic Properties; Annealing at 250° C. for one hour;
Forward Movement and Forward and Backward Movements)

| Sample No. | Film Thickness nm | i-Line Phase Difference deg. | Spectral Characteristic Properties | | Wavelength nm | 240 | 248 | 260 | 350 | 365 | 380 | 420 | 436 | 450 |
|---|---|---|---|---|---|---|---|---|---|---|---|---|---|---|
| 3 | 150.0 | 177.92 | Reflectance | % | | 18.27 | 17.99 | 17.64 | 16.01 | 16.40 | 17.10 | 19.39 | 20.14 | 20.58 |
| | | | Transmittance | % | | 0.4 | 0.6 | 0.9 | 5.2 | 6.2 | 7.3 | 10.1 | 11.2 | 12.1 |
| 4 | 150.0 | 178.21 | Reflectance | % | | 17.11 | 17.04 | 17.07 | 16.16 | 16.56 | 17.22 | 19.52 | 20.28 | 20.75 |
| | | | Transmittance | % | | 0.4 | 0.6 | 0.9 | 5.4 | 6.1 | 7.2 | 10.0 | 11.0 | 12.0 |
| 5 | 149.0 | 176.44 | Reflectance | % | | 16.78 | 16.81 | 16.83 | 16.05 | 16.50 | 17.25 | 19.62 | 20.34 | 20.75 |
| | | | Transmittance | % | | 0.5 | 0.7 | 1.0 | 5.4 | 6.5 | 7.6 | 10.4 | 11.5 | 12.5 |

TABLE 3

(Example 1: λ = 365 nm; Annealing at 250° C. for one hour; Forward Movement and Forward and Backward Movements)

| Sample No. | Number of Film-Forming Steps | Film Thickness Used For Calculation nm | Optical Constant n | Optical Constant k | Phase Difference (Found) deg. | Phase Difference (Calculated) deg. |
|---|---|---|---|---|---|---|
| 1 | 1 | 151 | 1.644 | 0.4993 | 180.41 | 92.92 |
| 2 | 4 | 151 | 2.320 | 0.4962 | 178.01 | 192.8 |
| 3 | 6 | 152.5 | 2.182 | 0.4922 | 177.92 | 173.81 |
| 4 | 8 | 152 | 2.191 | 0.4961 | 178.21 | 174.68 |
| 5 | 12 | 151 | 2.186 | 0.4881 | 176.44 | 172.66 |

TABLE 4

(Explanation of Example 1: λ = 365 nm)

| Number of Film-Forming Steps VN | Number of Layers V | Constitution of Film | | Optical Constant $n_j$ | Optical Constant $k_j$ | Film Thickness $d_j$ nm | Film Thickness per Single Film-Forming Step 152.5/VN nm | Averaged Optical Constant $\langle n \rangle$ | Averaged Optical Constant $\langle k \rangle$ | Remark |
|---|---|---|---|---|---|---|---|---|---|---|
| 1 | 3 | Air | Air | 1.0 | 0.0 | — | — | — | — | Film Constitutions are abbreviated as CBA. |
| | | Layer | C | 2.022 | 0.3940 | 48.50 | 152.5/1 | 2.220 | 0.4780 | |
| | | Layer | B | 2.330 | 0.5347 | 76.86 | | | | |
| | | Layer | A | 2.264 | 0.4673 | 27.15 | | | | |
| | | Substrate | QZ | 1.475 | 0.0 | — | — | — | — | |
| 2 | 6 | A | | 2.264 | 0.4673 | 13.57 | 152.5/2 | 2.220 | 0.4780 | Film Constitutions are abbreviated as ABC/CBA. |
| | | B | | 2.330 | 0.5347 | 38.43 | | | | |
| | | C | | 2.022 | 0.3940 | 24.25 | | | | |
| | | C | | 2.022 | 0.3940 | 24.25 | | | | |
| | | B | | 2.330 | 0.5347 | 38.43 | | | | |
| | | A | | 2.264 | 0.4673 | 13.57 | | | | |
| 3 | 9 | CBA/ABC/CBA | | | | | 152.5/3 | 2.220 | 0.4780 | The optical constant of each layer is the same as that observed for each corresponding layer A,B, C when VN = 1 in case of layers A,B,C. The layer thickness of the layer A, B or C is the value corre |
| 4 | 12 | (ABC/CBA)² | | | | | 152.5/4 | " | " | |
| 6 | 18 | (ABC/CBA)³ | | | | | 152.5/6 | " | " | |
| 8 | 24 | (ABC/CBA)⁴ | | | | | 152.5/8 | " | " | |
| 10 | 30 | (ABC/CBA)⁵ | | | | | 152.5/10 | " | " | |

TABLE 4-continued (Explanation of Example 1: λ = 365 nm)

| Number of Film-Forming Steps VN | Number of Layers V | Constitution of Film | Optical Constant $n_j$ | Optical Constant $k_j$ | Film Thickness $d_j$ nm | Film Thickness per Single Film-Forming Step 152.5/VN nm | Averaged Optical Constant <n> | Averaged Optical Constant <k> | Remark |
|---|---|---|---|---|---|---|---|---|---|
| 12 | 36 | (ABC/CBA)$^6$ | | | | 152.5/12 | " | " | sponding to the layer-thickness observed when VN = 1, divided by VN. |
| 14 | 42 | (ABC/CBA)$^7$ | | | | 152.5/14 | " | " | |
| 16 | 48 | (ABC/CBA)$^8$ | | | | 152.5/16 | " | " | |

TABLE 5

(Explanation of Example 1: λ = 365 nm)

| Number of Film-Forming Steps VN | Number of Layers V | Reflectance R % | Transmittance T % | Optical Constant Averaged Value <n> | Optical Constant Averaged Value <k> | Optical Constant Determined by Monolayer RT Method n | Optical Constant Determined by Monolayer RT Method k | Phase Difference Correct Value deg. | Phase Difference Approx. Value deg. |
|---|---|---|---|---|---|---|---|---|---|
| 1 | 3 | 10.69 | 6.90 | 2.220 | 0.4780 | 1.648 | 0.4944 | 180.7 | 94.52 |
| 2 | 6 | 19.79 | 6.45 | " | " | 2.492 | 0.4673 | 177.1 | 221.2 |
| 3 | 9 | 14.60 | 6.51 | " | " | 1.972 | 0.4914 | 178.9 | 142.4 |
| 4 | 12 | 16.71 | 6.09 | " | " | 2.217 | 0.4935 | 182.0 | 179.1 |
| 6 | 18 | 15.65 | 6.48 | " | " | 2.094 | 0.4872 | 181.0 | 160.8 |
| 8 | 24 | 16.14 | 6.49 | " | " | 2.161 | 0.4839 | 180.6 | 170.7 |
| 10 | 30 | 16.33 | 6.49 | " | " | 2.186 | 0.4827 | 180.5 | 174.6 |
| 12 | 36 | 16.43 | 6.49 | " | " | 2.199 | 0.4822 | 180.5 | 176.6 |
| 14 | 42 | 16.48 | 6.49 | " | " | 2.206 | 0.4819 | 180.4 | 177.6 |
| 16 | 48 | 16.52 | 6.49 | " | " | 2.211 | 0.4817 | 180.4 | 178.3 |

TABLE 6

(Example 2: Forward Movement)

| Sample No. | Ar Flow Rate SCCM | NO Flow Rate SCCM | Film-Forming Pressure mTorr | Sputtering Current A | Sputtering Voltage V | Number of Film-Forming Steps | Conveying Speed mm/mm | Annealing Conditions |
|---|---|---|---|---|---|---|---|---|
| 21 | 190 | 6.5 | ~4 | 0.67 | 386 | 1 | 35 | 250° C., 1 hr |
| 22 | 190 | 6.5 | ~4 | 0.67 | 388 | 4 | 35 × 4 = 140 | 250° C., 1 hr |
| 23 | " | " | " | " | 383 | 8 | 35 × 8 = 280 | " |
| 24 | " | " | " | " | 383 | 10 | 35 × 10 = 350 | " |
| 25 | " | " | " | " | 383 | 12 | 35 × 12 = 420 | " |
| 31 | 190 | 6.5 | ~4 | 0.67 | 386 | 1 | 35 | 350° C., 3 hrs |
| 32 | 190 | 6.5 | ~4 | 0.67 | 388 | 4 | 35 × 4 = 140 | 350° C., 3 hrs |
| 33 | " | " | " | " | 383 | 8 | 35 × 8 = 280 | " |
| 34 | " | " | " | " | 383 | 10 | 35 × 10 = 350 | " |
| 35 | " | " | " | " | 383 | 12 | 35 × 12 = 420 | " |

TABLE 7

(Example 2: Optical Characteristic Properties; Annealing at 250° C. for one hour (Sample Nos. 21–26); Annealing at 350° C. for 3 hours (Sample Nos. 31–36); Forward Movement)

| Sample No. | Film Thickness nm | i-Line Phase Difference deg. | Spectral Characteristic Properties | | Wavelength nm | 248 | 350 | 365 | 380 | 420 | 436 | 450 | 488 | 546 |
|---|---|---|---|---|---|---|---|---|---|---|---|---|---|---|
| 21 | ~139 | 158.46 | Reflectance | % | | 6.69 | 10.08 | 10.73 | 11.18 | 11.11 | 10.56 | 9.90 | 7.65 | 4.56 |
|    |      |        | Transmittance | % | | 1.2 | 7.6 | 8.9 | 10.1 | 13.5 | 14.9 | 16.2 | 19.8 | 25.4 |
| 22 | ~150 | 163.95 | Reflectance | % | | 15.39 | 15.16 | 15.78 | 16.65 | 18.91 | 19.51 | 19.79 | 19.46 | 16.89 |
|    |      |        | Transmittance | % | | 0.9 | 6.1 | 7.2 | 8.2 | 11.0 | 12.0 | 13.0 | 15.5 | 19.6 |
| 23 | ~150 | 160.61 | Reflectance | % | | 14.93 | 14.76 | 15.53 | 16.44 | 18.47 | 18.85 | 18.98 | 18.27 | 15.52 |
|    |      |        | Transmittance | % | | 1.1 | 6.8 | 8.0 | 9.1 | 11.9 | 13.1 | 14.1 | 16.7 | 21.4 |
| 24 | ~150 | 162.70 | Reflectance | % | | 15.50 | 15.13 | 15.79 | 16.62 | 18.60 | 19.01 | 19.16 | 18.57 | 15.95 |
|    |      |        | Transmittance | % | | 0.9 | 6.2 | 7.3 | 8.4 | 11.1 | 12.6 | 13.2 | 15.8 | 20.0 |
| 25 | ~150 | 161.71 | Reflectance | % | | 14.26 | 13.80 | 14.44 | 15.22 | 17.05 | 17.38 | 17.47 | 16.90 | 14.36 |
|    |      |        | Transmittance | % | | 1.1 | 7.2 | 8.3 | 9.4 | 12.4 | 13.6 | 14.5 | 17.3 | 21.8 |
| 26 (Ref) | ~168 | 180.50 | Reflectance | % | | 14.90 | 14.09 | 14.13 | 14.56 | 17.00 | 18.08 | 18.88 | 19.98 | 18.63 |
|    |      |        | Transmittance | % | | 0.7 | 6.3 | 7.6 | 8.9 | 12.2 | 13.4 | 14.4 | 17.1 | 21.5 |
| 31 | ~130 | 149.48 | Reflectance | % | | 10.87 | 1.54 | 1.20 | 1.05 | 0.87 | 0.37 | 0.66 | 0.48 | 1.39 |
|    |      |        | Transmittance | % | | 1.9 | 11.1 | 12.8 | 14.4 | 18.7 | 20.4 | 21.9 | 25.8 | 30.9 |
| 32 | ~150 | 161.70 | Reflectance | % | | 9.16 | 10.89 | 11.84 | 12.96 | 15.65 | 16.36 | 16.73 | 16.65 | 14.58 |
|    |      |        | Transmittance | % | | 1.0 | 6.6 | 7.6 | 8.6 | 11.2 | 12.2 | 13.1 | 15.5 | 19.5 |
| 33 | ~150 | 160.97 | Reflectance | % | | 10.81 | 12.43 | 13.34 | 14.38 | 16.66 | 17.18 | 17.41 | 17.02 | 14.79 |
|    |      |        | Transmittance | % | | 1.0 | 6.4 | 7.5 | 8.5 | 11.0 | 12.1 | 12.9 | 15.4 | 19.5 |
| 34 | ~150 | 163.44 | Reflectance | % | | 12.24 | 13.15 | 13.95 | 14.88 | 17.03 | 17.53 | 17.78 | 17.40 | 15.13 |
|    |      |        | Transmittance | % | | 0.9 | 6.2 | 7.2 | 8.2 | 10.8 | 11.8 | 12.7 | 15.2 | 19.2 |
| 35 | ~150 | 161.41 | Reflectance | % | | 11.71 | 12.91 | 13.82 | 14.85 | 17.18 | 17.70 | 17.93 | 17.50 | 15.06 |
|    |      |        | Transmittance | % | | 1.1 | 7.0 | 8.1 | 9.1 | 11.9 | 12.9 | 13.8 | 16.4 | 20.7 |
| 36 (Ref) | ~168 | 175.67 | Reflectance | % | | 10.77 | 10.99 | 11.32 | 12.03 | 14.82 | 15.84 | 16.54 | 17.26 | 15.56 |
|    |      |        | Transmittance | % | | 1.1 | 7.9 | 9.4 | 10.8 | 14.3 | 15.6 | 16.7 | 19.6 | 24.3 |

TABLE 8

(Example 2 Annealing at 250° C. for one hour)

| Sample No. | Number of Film-Forming Steps | Film Thickness Used For Calculation nm | Optical Constant | | Phase Difference | |
|---|---|---|---|---|---|---|
| | | | n | k | (Found) deg. | (Calculated) deg. |
| 21 | 1 | 150 | 1.682 | 0.4504 | 158.46 | 98.06 |
| 22 | 4 | 150 | 2.095 | 0.4757 | 163.95 | 158.17 |
| 23 | 8 | 150 | 2.085 | 0.4546 | 160.61 | 156.81 |
| 24 | 10 | 150 | 2.099 | 0.4728 | 162.70 | 158.80 |
| 25 | 12 | 157 | 2.060 | 0.4304 | 161.71 | 160.80 |
| 26 (Ref) | — | 168 | 2.108 | 0.4154 | 180.50 | 180.60 |

TABLE 9

(Example 3: Film-Forming Conditions for Quasi-Monolayer Film for KrF 6%; Forward and Backward Movements)

| Sample No. | Purpose of Film | Flow Rate | | Pressure mTorr | Current A | Voltage V | Number of Film-Forming Steps × 2 | Conveying Speed mm/min | Annealing |
|---|---|---|---|---|---|---|---|---|---|
| | | Ar SCCM | NO SCCM | | | | | | |
| 41 | For 1st Layer | 150 | 34 | 5.7 | 2 | 524 | 4 | 360 | Not Annealed |
| 42 | " | " | " | 5.8 | " | 524 | 6 | 540 | and Annealed at 305° C. for 3 hours. |
| 43 | " | " | " | 5.7 | " | 525 | 8 | 720 | |
| 44 | " | " | " | 5.7 | " | 526 | 12 | 1080 | |

TABLE 9-continued (Example 3: Film-Forming Conditions for Quasi-Monolayer Film for KrF 6%; Forward and Backward Movements)

| Sample No. | Purpose of Film | Flow Rate Ar SCCM | Flow Rate NO SCCM | Pressure mTorr | Current A | Voltage V | Number of Film-Forming Steps × 2 | Conveying Speed mm/min | Annealing |
|---|---|---|---|---|---|---|---|---|---|
| 45 | " | 150 | 42.5 | 5.8 | 3 | 567 | 4 | 520 | Not Annealed |
| 46 | " | " | " | 6.0 | " | 566 | 6 | 780 | |
| 47 | " | " | " | 6.0 | " | 565 | 8 | 1040 | and Annealed at 305° C. for 3 hours. |
| 51 | For 2nd Layer | 30 | 8.4 | 1.2 | 0.5 | 504 | 4 | 400 | Not Annealed |
| 52 | " | " | " | 1.1 | " | 503 | 6 | 600 | |
| 53 | " | " | " | ~1 | " | 502 | 8 | 800 | and Annealed at 305° C. for 3 hours. |
| 54 | " | " | " | 1.2 | " | 504 | 12 | 1200 | |
| 55 | " | 30 | 20 | 0.96 | " | 572 | 4 | 880 | Not Annealed |
| 56 | " | " | " | ~1 | " | 569 | 6 | 1320 | and Annealed at 305° C. for 3 hours. |

TABLE 10

(Example 3: Optical Characteristics of the annealing-free product for KrF 6%; Forward and Backward Movements)

| Sample No. | Film Thickness nm | Phase Difference Wavelength (nm) 248 deg. | Phase Difference Wavelength (nm) 365 deg. | | | Spectral Reflectance (R) and Spectral Transmittance (T) Wavelength (nm) 240 | 248 | 260 | 350 | 365 | 380 | 420 | 436 | 450 | 488 | Remarks |
|---|---|---|---|---|---|---|---|---|---|---|---|---|---|---|---|---|
| 41 | (88) | 113.4 | 76.69 | R | % | 14.34 | 14.07 | 13.45 | 7.92 | 7.96 | 8.35 | 10.54 | 11.69 | 12.73 | 15.43 | The number in |
|    |      |       |       | T | % | 16.42 | 18.20 | 20.99 | 42.05 | 44.92 | 47.62 | 53.10 | 54.78 | 56.00 | 58.58 | the parenthesis |
| 42 | (89) | 114.9 | 80.19 | R | % | 14.45 | 14.23 | 13.66 | 7.99 | 8.00 | 8.35 | 10.52 | 11.68 | 12.74 | 15.51 | indicates the |
|    |      |       |       | T | % | 15.85 | 17.55 | 20.22 | 40.83 | 43.73 | 46.40 | 51.20 | 53.67 | 54.95 | 57.47 | film thickness |
| 43 | (89) | 114.9 | 80.78 | R | % | 14.41 | 14.20 | 13.65 | 7.97 | 7.98 | 8.35 | 10.56 | 11.75 | 12.81 | 15.61 | determined by |
|    |      |       |       | T | % | 15.98 | 17.69 | 20.42 | 41.33 | 44.23 | 46.97 | 52.55 | 54.23 | 55.52 | 58.04 | analytical |
| 44 | (91) | 112.5 | 79.24 | R | % | 13.80 | 13.65 | 13.25 | 7.66 | 7.63 | 7.96 | 10.18 | 11.37 | 12.44 | 15.26 | method |
|    |      |       |       | T | % | 16.78 | 18.55 | 21.32 | 42.47 | 45.27 | 47.93 | 53.27 | 54.90 | 56.07 | 58.53 | |
| 45 | 80 | — | 82.62 | R | % | 14.21 | 14.04 | 13.58 | 8.07 | 7.95 | 8.13 | 9.97 | 11.05 | 12.06 | 14.88 | |
|    |    |   |       | T | % | 14.6 | 16.2 | 18.7 | 38.2 | 41.2 | 44.0 | 50.0 | 51.9 | 53.3 | 56.2 | |
| 46 | 91 | — | — | R | % | 14.67 | 14.68 | 14.35 | 8.41 | 8.04 | 8.00 | 9.40 | 10.39 | 11.37 | 14.17 | |
|    |    |   |   | T | % | 15.6 | 17.3 | 19.9 | 40.2 | 43.3 | 45.9 | 51.6 | 53.4 | 54.3 | 57.3 | |
| 47 | 92 | — | — | R | % | 14.10 | 14.27 | 14.28 | 8.52 | 7.95 | 7.78 | 8.90 | 9.84 | 10.78 | 13.60 | |
|    |    |   |   | T | % | 14.0 | 15.5 | 18.0 | 37.7 | 41.1 | 44.0 | 50.7 | 53.2 | 54.3 | 57.4 | |
| 51 | 40 | 55.8 | 41.51 | R | % | 22.39 | 23.13 | 24.29 | 30.28 | 30.74 | 31.04 | 31.37 | 31.36 | 31.26 | 30.90 | |
|    |    |      |       | T | % | 20.8 | 22.2 | 24.0 | 33.9 | 35.2 | 36.3 | 38.9 | 39.9 | 40.7 | 42.8 | |
| 52 | 41 | 56.7 | 41.77 | R | % | 23.48 | 24.14 | 25.30 | 31.18 | 31.63 | 31.94 | 32.30 | 32.29 | 32.24 | 31.88 | |
|    |    |      |       | T | % | 19.4 | 20.7 | 22.5 | 32.1 | 33.2 | 34.3 | 36.9 | 37.8 | 38.6 | 40.6 | |
| 53 | 40 | 55.4 | 42.26 | R | % | 23.63 | 24.36 | 25.43 | 31.37 | 31.85 | 32.19 | 32.60 | 32.63 | 32.58 | 32.24 | |
|    |    |      |       | T | % | 18.9 | 20.2 | 22.0 | 31.4 | 32.5 | 33.6 | 36.1 | 37.1 | 37.8 | 39.9 | |
| 54 | 40 | 55.6 | 41.81 | R | % | 22.54 | 23.35 | 24.54 | 30.73 | 31.21 | 31.53 | 31.96 | 31.97 | 31.90 | 31.56 | |
|    |    |      |       | T | % | 20.2 | 21.5 | 23.3 | 33.0 | 34.2 | 35.2 | 37.8 | 38.8 | 39.5 | 41.6 | |
| 55 | 38 | — | 42.82 | R | % | 21.73 | 22.41 | 23.51 | 30.12 | 30.67 | 31.07 | 31.66 | 31.74 | 31.71 | 31.49 | |
|    |    |   |       | T | % | 19.4 | 20.8 | 22.6 | 32.5 | 33.7 | 34.7 | 37.4 | 38.3 | 39.1 | 41.2 | |
| 56 | 38 | — | 43.54 | R | % | 22.24 | 22.86 | 23.96 | 30.58 | 31.14 | 31.57 | 32.18 | 32.27 | 32.28 | 32.08 | |
|    |    |   |       | T | % | 18.5 | 19.9 | 21.7 | 34.1 | 32.5 | 33.5 | 36.1 | 36.9 | 37.7 | 39.7 | |

TABLE 11

(Example 3: Optical Characteristics and Phase Difference of the Annealing-Free Quasi-Monolayer Film for KrF 6%)

| | | Number of Film-Forming | Film Thick- | Wavelength (nm) | | | | | | | |
|---|---|---|---|---|---|---|---|---|---|---|---|
| | | | | 248 | | | | 365 | | | |
| | | | | Optical Constant | | Phase Difference | | Optical Constant | | Phase Difference | |
| Sample No. | Pur- pose of Film | Steps × 2 | ness nm | n | k | Found Deg. | Calculated deg. | n | k | Found deg. | Calculated deg. |
| 41 | For | 4 | 88 | 1.913 | 0.3440 | 113.4 | 114.4 | 1.883 | 0.2313 | 79.69 | 75.17 |
| 42 | 1st | 6 | 89 | 1.918 | 0.3478 | 114.9 | 116.2 | 1.901 | 0.2361 | 80.19 | 77.74 |
| 43 | Layer | 8 | 89 | 1.916 | 0.3463 | 114.9 | 116.1 | 1.901 | 0.2326 | 80.78 | 77.76 |
| 44 | | 12 | 91 | 1.887 | 0.3309 | 112.5 | 114.9 | 1.863 | 0.2217 | 79.24 | 76.2 |
| 45 | For | 4 | 92 | 1.904 | 0.3554 | — | 118.2 | 1.894 | 0.2458 | 82.62 | 79.92 |
| 46 | 1st | 6 | 91 | 1.937 | 9.3429 | — | 121.3 | 1.921 | 0.2326 | — | 81.50 |
| 47 | Layer | 8 | 92 | 1.916 | 0.3651 | — | 119.7 | 1.893 | 0.2466 | — | 79.85 |
| 51 | For | 4 | 36.3 | 2.190 | 0.7148 | 55.8 | 55.57 | 2.312 | 0.5614 | 41.51 | 41.30 |
| 52 | 2nd | 6 | 35.8 | 2.236 | 0.7572 | 56.7 | 56.67 | 2.346 | 0.6089 | 41.77 | 41.39 |
| 53 | Layer | 8 | 35.6 | 2.224 | 0.7769 | 55.4 | 55.54 | 2.361 | 0.6126 | 42.26 | 42.75 |
| 54 | | 12 | 36.2 | 2.189 | 0.7349 | 55.6 | 55.18 | 2.330 | 0.5851 | 41.81 | 41.32 |
| 55 | For 2nd | 4 | 37.7 | 2.216 | 0.7236 | — | 59.48 | 2.316 | 0.5809 | 42.82 | 42.80 |
| 56 | Layer | 6 | 37.9 | 2.325 | 0.7311 | — | 65.66 | 2.339 | 0.6025 | 43.54 | 43.60 |

TABLE 12

(Example 3: Resistance to Chemicals of the Annealed Quasi-Monolayer Product for KrF 6% (Annealing at 350° C. for 3 hours))

| | | Num- ber of Film- Form- ing Steps × 2 | Aqueous Ammonia (0.5%, 60 min) | | | | | | Sulfuric Acid-Peracid (60 min) | | | | | |
|---|---|---|---|---|---|---|---|---|---|---|---|---|---|---|
| | | | Transmittance (Wavelength: 248nm) | | | Phase Difference (Wavelength: 365 nm) | | | Transmittance (Wavelength: 248 nm) | | | Phase Difference (Wavelength: 365 nm) | | |
| Sam- ple No. | Purpose of Film | | Prior to Treat- ment % | After Treat- ment % | Rate of Change % | Prior to Treatment deg. | After Treatment deg. | Rate of Change % | Prior to Treat- ment % | After Treat- ment % | Rate of Change % | Prior to Treatment deg. | After Tre Treatment deg. | Rate of Change % |
| 41 | For 1st Layer | 4 | 80.2 | 85.95 | 7.170 | 43.39 | 33.16 | −23.58 | 81.77 | 89.5 | 9.453 | 41.38 | 38.52 | −6.912 |
| 42 | For 1st Layer | 6 | 83.30 | 88.35 | 6.062 | 43.39 | 32.41 | −25.30 | 83 | 90.32 | 8.819 | 41.88 | 38.53 | −8.000 |
| 43 | For 1st Layer | 8 | 79.25 | 87.30 | 10.16 | 43.57 | 32.95 | −24.37 | 81.55 | 89.99 | 10.35 | 42.3 | 38.6 | −8.747 |
| 44 | For 1st Layer | 12 | 79.05 | 87.13 | 10.22 | 43.38 | 34.07 | −21.46 | 79.82 | 90.38 | 13.23 | 42.82 | 37.92 | −11.44 |
| 45 | For 1st Layer | 4 | 48.00 | 80.10 | 66.88 | 59.01 | 17.49 | −70.36 | 60.08 | 91.62 | 52.50 | 55.31 | 41.73 | −24.55 |
| 46 | For 1st Layer | 6 | 50.40 | 68.40 | 35.71 | 58.64 | 11.64 | −80.15 | 67.05 | 91.5 | 36.46 | 54.67 | 43.95 | −19.61 |
| 47 | For 1st Layer | 8 | 45.30 | 81.60 | 80.13 | 59.80 | 8.81 | −85.27 | 67.77 | 91.67 | 35.27 | 52.71 | 41.62 | −21.04 |
| 51 | For 2nd Layer | 4 | 27.68 | 27.65 | −0.108 | 39.47 | 39.39 | −0.203 | 27.1 | 27.3 | 0.738 | 39.6 | 39.58 | −0.050 |
| 52 | For 2nd Layer | 6 | 25.83 | 25.78 | −0.194 | 39.94 | 39.69 | −0.626 | 25.17 | 25.46 | 1.152 | 39.67 | 39.44 | −0.580 |
| 53 | For 2nd Layer | 8 | 25.05 | 25.03 | −0.080 | 39.61 | 39.99 | 0.959 | 24.26 | 24.52 | 1.072 | 39.39 | 39.45 | 0.152 |
| 54 | For 2nd Layer | 12 | 26.00 | 25.97 | −0.115 | 39.75 | 39.72 | −0.0755 | 25.43 | 25.7 | 1.062 | 40.11 | 39.87 | −0.5984 |

TABLE 12-continued (Example 3: Resistance to Chemicals of the Annealed Quasi-Monolayer Product for KrF 6% (Annealing at 350° C. for 3 hours))

| | | Number of Film-Forming Steps × 2 | Aqueous Ammonia (0.5%, 60 min) | | | | | | Sulfuric Acid-Peracid (60 min) | | | | | |
|---|---|---|---|---|---|---|---|---|---|---|---|---|---|---|
| | | | Transmittance (Wavelength: 248nm) | | | Phase Difference (Wavelength: 365 nm) | | | Transmittance (Wavelength: 248 nm) | | | Phase Difference (Wavelength: 365 nm) | | |
| Sample No. | Purpose of Film | | Prior to Treatment % | After Treatment % | Rate of Change % | Prior to Treatment deg. | After Treatment deg. | Rate of Change % | Prior to Treatment % | After Treatment % | Rate of Change % | Prior to Treatment deg. | After Treatment deg. | Rate of Change % |
| 55 | For 2nd Layer | 4 | 26.10 | 25.90 | −0.766 | 41.79 | 41.94 | 0.359 | 25.32 | 25.31 | −0.0395 | 41.59 | 42.07 | 1.154 |
| 56 | For 2nd Layer | 6 | 24.90 | 24.80 | −0.402 | 41.17 | 41.44 | 0.656 | 23.93 | 23.95 | 0.0836 | 41.49 | 41.6 | 0.2651 |

TABLE 13

(Example 4: Film-Forming Conditions for Quasi-Bilayer Film for KrF 6%; Forward and Backward Movements)

| Sample No. | Layer | Flow Rate Ar SCCM | Flow Rate NO SCCM | Pressure mTorr | Current A | Voltage V | Number of Film-Forming Steps × 2 | Conveying Speed mm/min | Annealing |
|---|---|---|---|---|---|---|---|---|---|
| 61 | 2nd Layer | 30 | 9 | 1.0 | 0.5 | 500 | 4 | 360 | Not Annealed |
| | 1st Layer | 150 | 34 | 5.6 | 2.0 | 525 | 4 | 320 | and Annealed at 350° C. for 3 hrs. |
| 62 | 2nd Layer | 30 | 8.4 | 1.0 | 0.5 | 504 | 6 | 600 | Not Annealed |
| | 1st Layer | 150 | 34 | 5.4 | 2.0 | 524 | 6 | 510 | and Annealed at 350° C. for 3 hrs. |
| 63 | 2nd Layer | 30 | 9 | 1.1 | 0.5 | 502 | 4 | 380 | Not Annealed |
| | 1st Layer | 150 | 34 | 5.5 | 2.0 | 522 | 6 | 480 | and Annealed at 350° C. for 3 hrs. |
| 64 | 2nd Layer | 30 | 9 | 1.0 | 0.5 | 501 | 6 | 600 | Not Annealed |
| | 1st Layer | 150 | 34 | 5.6 | 2.0 | 520 | 4 | 320 | and Annealed at 350° C. for 3 hrs. |
| 65 | 2nd Layer | 30 | 20 | 1.0 | 1 | 573 | 4 | 880 | Not Annealed |
| | 1st Layer | 150 | 42.5 | 6.0 | 3 | 568 | 4 | 520 | and Annealed at 350° C. for 3 hrs. |
| 66 | 2nd Layer | 30 | 20 | 1.0 | 1 | 565 | 6 | 1320 | Not Annealed |
| | 1st Layer | 150 | 42.5 | 6.0 | 3 | 569 | 6 | 780 | and Annealed at 350° C. for 3 hrs. |
| 67 | 2nd Layer | 30 | 20 | 1.0 | 1 | 571 | 4 | 880 | Not Annealed |
| | 1st Layer | 150 | 42.5 | ~6 | 3 | 568 | 8 | 1040 | and Annealed at 350° C. for 3 hrs. |

TABLE 14

(Example 4: Optical Characteristics of the Annealing-Free Quasi-Bilayer Film for KrF 6%; Forward and Backward Movements)

| Sample No. | Film Thickness (nm) | Phase Difference Wavelength (nm) 248 deg. | Phase Difference Wavelength (nm) 365 deg. | | | Spectral Reflectance (R) and Spectral Transmittance (T) Wavelength (nm) | | | | | | | | | |
|---|---|---|---|---|---|---|---|---|---|---|---|---|---|---|---|
| | | | | | | 240 | 248 | 260 | 350 | 365 | 380 | 420 | 436 | 450 | 488 |
| 61 | 116 | 193.9 | 138.28 | R | % | 18.08 | 17.96 | 17.95 | 23.87 | 24.96 | 25.67 | 25.78 | 25.21 | 24.51 | 22.22 |
| | | | | T | % | 2.8 | 3.4 | 4.4 | 13.7 | 15.2 | 16.6 | 20.7 | 22.3 | 23.8 | 27.9 |
| 62 | 118 | 165.85 | 118.44 | R | % | 21.46 | 21.50 | 21.77 | 24.70 | 24.02 | 23.04 | 19.72 | 18.34 | 17.25 | 15.13 |
| | | | | T | % | 5.2 | 6.1 | 7.6 | 19.1 | 21.0 | 23.0 | 28.7 | 31.0 | 33.0 | 38.3 |
| 63 | 140 | — | — | R | % | 19.76 | 19.63 | 19.57 | 24.95 | 26.10 | 26.89 | 27.14 | 26.62 | 25.95 | 23.72 |
| | | | | T | % | 2.6 | 3.1 | 4.1 | 13.4 | 14.9 | 16.3 | 20.2 | 21.8 | 23.3 | 27.4 |

TABLE 14-continued (Example 4: Optical Characteristics of the Annealing-Free Quasi-Bilayer Film for KrF 6%; Forward and Backward Movements)

| Sample No. | Film Thickness (nm) | Phase Difference Wavelength (nm) 248 deg. | 365 deg. | | | Spectral Reflectance (R) and Spectral Transmittance (T) Wavelength (nm) | | | | | | | | | |
|---|---|---|---|---|---|---|---|---|---|---|---|---|---|---|---|
| | | | | | | 240 | 248 | 260 | 350 | 365 | 380 | 420 | 436 | 450 | 488 |
| 64 | 95 | 168.2 | 121.7 | R | % | 18.48 | 18.59 | 18.98 | 23.86 | 23.70 | 23.18 | 20.58 | 19.32 | 18.24 | 15.86 |
| | | | | T | % | 4.9 | 5.9 | 7.3 | 18.2 | 20.1 | 22.0 | 27.2 | 29.4 | 31.3 | 36.4 |
| 65 | 125 | — | — | R | % | 19.19 | 19.22 | 19.46 | 26.06 | 26.60 | 26.72 | 25.60 | 24.76 | 23.99 | 21.98 |
| | | | | T | % | 3.0 | 3.6 | 4.6 | 13.4 | 14.9 | 16.3 | 20.6 | 22.4 | 24.0 | 28.8 |
| 66 | 120 | — | 113.87 | R | % | 19.10 | 19.46 | 20.34 | 25.08 | 24.74 | 24.15 | 22.16 | 21.43 | 20.90 | 20.30 |
| | | | | T | % | 4.3 | 5.0 | 6.2 | 15.7 | 17.5 | 19.3 | 24.4 | 26.6 | 28.4 | 33.0 |
| 67 | 130 | — | 126.56 | R | % | 19.08 | 19.10 | 19.42 | 26.03 | 26.37 | 26.30 | 24.82 | 23.89 | 23.11 | 21.18 |
| | | | | T | % | 3.3 | 4.0 | 5.1 | 14.1 | 15.7 | 17.2 | 21.7 | 23.6 | 25.3 | 30.0 |

TABLE 15

(Example 4: Optical Characteristics and Phase Difference of the Annealed Quasi-Bilayer Product for KrF 6%; Forward and Backward Movements)

| Sample No. | Layer | Number of Film-Forming Steps ×2 | Film Thickness nm | Wavelength (nm) 248 | | | | 365 | | | |
|---|---|---|---|---|---|---|---|---|---|---|---|
| | | | | Optical Constant | | Phase Difference | | Optical Constant | | Phase Difference | |
| | | | | n | k | Found deg. | Calculated deg. | n | k | Found deg. | Calculated deg. |
| 61 | 2nd Layer | 4 | 41.76 | 2.090 | 0.6841 | | | 2.246 | 0.5733 | | |
| | 1st Layer | 4 | 101.24 | 1.913 | 0.3440 | | | 1.883 | 0.2313 | | |
| | Whole Layer | | 143 | | | 193.9 | 195.86 | | | 138.28 | 133.92 |
| 62 | 2nd Layer | 6 | 33.28 | 2.272 | 0.6732 | | | 2.258 | 0.5123 | | |
| | 1st Layer | 6 | 82.72 | 1.918 | 0.3478 | | | 1.978 | 0.2361 | | |
| | Whole Layer | | 116 | | | 165.85 | 166.44 | | | 118.44 | 117.95 |
| 63 | 2nd Layer | 4 | 38.67 | 2.097 | 0.7751 | | | 2.263 | 0.6114 | | |
| | 1st Layer | 6 | 101.33 | 1.918 | 0.3478 | | | 1.901 | 0.2361 | | |
| | Whole Layer | | 140 | | | — | 191.48 | | | — | 132.48 |
| 64 | 2nd Layer | 6 | 35.28 | 2.136 | 0.6406 | | | 2.201 | 0.5221 | | |
| | 1st Layer | 4 | 86.72 | 1.913 | 0.3440 | | | 1.983 | 0.2317 | | |
| | Whole Layer | | 122 | | | 168.2 | 168.58 | | | 121.70 | 121.98 |
| 65 | 2nd Layer | 4 | 38.95 | 2.132 | 0.7297 | | | 2.291 | 0.6059 | | |
| | 1st Layer | 4 | 95.05 | 1.904 | 0.3554 | | | 1.894 | 0.2458 | | |
| | Whole Layer | | 134 | | | — | 183.93 | | | 128.13 | 127.91 |
| 66 | 2nd Layer | 6 | 35.28 | 2.079 | 0.7676 | | | 2.313 | 0.6440 | | |
| | 1st Layer | 6 | 84.72 | 1.937 | 0.3429 | | | 1.921 | 0.2326 | | |
| | Whole Layer | | 120 | | | — | 165.25 | | | 113.87 | 114.49 |
| 67 | 2nd Layer | 4 | 38.51 | 2.177 | 0.6633 | | | 2.287 | 0.5744 | | |
| | 1st Layer | 8 | 93.99 | 1.916 | 0.3651 | | | 1.893 | 0.2446 | | |
| | Whole Layer | | 132.5 | | | — | 186.2 | | | 126.56 | 126.59 |

TABLE 16

(Example 4: Resistance to Chemicals of the Annealed (at 350° C., for 3 hours) Quasi-Bilayer Film for KrF 6%)

| Sample No. | Layer | Number of Film-Forming Steps | Aqueous Ammonia 0.5% 60 min | | | | | |
|---|---|---|---|---|---|---|---|---|
| | | | Transmittance (Wavelength: 248 nm) | | | Phase Difference (Wavelength: 365 nm) | | |
| | | | Prior to Treatment % | After Treatment % | Rate of Change % | Prior to Treatment deg. | After Treatment deg. | Rate of Change % |
| 61 | 2nd Layer | 4 | 5.92 | 5.92 | 0.00 | 189.40 | 189.10 | −0.158 |
|  | 1st Layer | 4 | | | | | | |
| 62 | 2nd Layer | 6 | 10.37 | 10.37 | 0.00 | 159.90 | 159.50 | −0.250 |
|  | 1st Layer | 6 | | | | | | |
| 63 | 2nd Layer | 4 | 5.92 | 5.99 | 1.182 | 190.80 | 190.40 | −0.210 |
|  | 1st Layer | 6 | | | | | | |
| 64 | 2nd Layer | 6 | 9.20 | 9.31 | 1.196 | 161.70 | 162.70 | 0.618 |
|  | 1st Layer | 4 | | | | | | |
| 65 | 2nd Layer | 4 | 5.30 | 5.30 | 0.00 | 173.45 | 173.90 | 0.259 |
|  | 1st Layer | 4 | | | | | | |
| 66 | 2nd Layer | 6 | 7.70 | 7.70 | 0.00 | 153.45 | 154.30 | 0.554 |
|  | 1st Layer | 6 | | | | | | |
| 67 | 2nd Layer | 4 | 6.60 | 6.60 | 0.00 | 169.95 | 171.25 | 0.765 |
|  | 1st Layer | 8 | | | | | | |

| Sample No. | Sulfuric Acid-Peracid 60 min | | | | | |
|---|---|---|---|---|---|---|
| | Transmittance (Wavelength: 248 nm) | | | Phase Difference (Wavelength: 365 nm) | | |
| | Prior to Treatment % | After Treatment % | Rate of Change % | Prior to Treatment deg. | After Treatment deg. | Rate of Change % |
| 61 | 6.4 | 6.49 | 1.406 | 185.3 | 185.3 | 0.00 |
| 62 | 11.29 | 11.43 | 1.240 | 1537 | 155 | 0.846 |
| 63 | 6.29 | 6.38 | 1.431 | 184.7 | 185.5 | 0.433 |
| 64 | 9.92 | 10.06 | 1.411 | 159.4 | 159.1 | −0.188 |
| 65 | 6.95 | 6.94 | −0.144 | 171.90 | 170.90 | −0.582 |
| 66 | 8.24 | 8.23 | −0.121 | 149.10 | 148.10 | −0.671 |
| 67 | 7.28 | 7.29 | 0.137 | 167.30 | 164.50 | −1.674 |

What is claimed is:

1. A device for manufacturing a phase-shifting photomask blank in which a thin film is formed by supplying a reactive gas to a film-forming chamber and depositing said thin film on a substrate using reactive sputtering technique, while passing said substrate over a target, wherein it is designed to have an opening of a shielding plate whose length is sufficiently enlarge along a substrate conveying direction so that even regions whose deposition rate of a target component is not more than 90% of a maximum level thereof also contribute to the film-formation.

2. An apparatus for preparing a phase-shifting photomask blank comprising:

a film forming chamber;

means for supplying a reactive gas to said film forming chamber;

means for depositing a thin film on a substrate by reactive sputtering technique while passing said substrate over a target at least four times, and wherein said apparatus further comprises a means for forming said thin film through a opening having a sufficiently enlarged length along a substrate-conveying direction so that even those regions whose deposition rate of a target component is not more than 90% of the maximum level thereof also contribute to film-formation.

* * * * *